(12) United States Patent
Jablon et al.

(10) Patent No.: US 11,712,971 B2
(45) Date of Patent: *Aug. 1, 2023

(54) APPARATUS FOR RECONFIGURING INTERNAL POWER SOURCE AND LOAD IMPEDANCE ELEMENTS

(71) Applicant: Gravic, Inc., Malvern, PA (US)

(72) Inventors: Asher H. Jablon, Dresher, PA (US); Bruce D. Holenstein, Malvern, PA (US); Dylan R. Holenstein, Media, PA (US)

(73) Assignee: GRAVIC, INC., Malvern, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/087,366

(22) Filed: Dec. 22, 2022

(65) Prior Publication Data

US 2023/0128633 A1 Apr. 27, 2023

Related U.S. Application Data

(63) Continuation of application No. 16/876,883, filed on May 18, 2020, now Pat. No. 11,548,396.

(60) Provisional application No. 62/970,449, filed on Feb. 5, 2020.

(51) Int. Cl.
*B60L 15/20* (2006.01)
*B60L 58/12* (2019.01)
*H03H 7/40* (2006.01)

(52) U.S. Cl.
CPC ........... *B60L 15/2045* (2013.01); *B60L 58/12* (2019.02); *H03H 7/40* (2013.01)

(58) Field of Classification Search
CPC ................................ B60L 58/12; H03H 7/40
See application file for complete search history.

*Primary Examiner* — James J Lee
*Assistant Examiner* — Wenyuan Yang
(74) *Attorney, Agent, or Firm* — Clark A. Jablon

(57) ABSTRACT

An apparatus is provided for adjusting an electrical configuration of a plurality of components of an electrical network associated with a vehicle in order to tune electrical characteristics of the electrical network to continuously match a dynamically changing desired mode of operation of the electrical network associated with the vehicle.

13 Claims, 23 Drawing Sheets

Electrical Tuning Engine

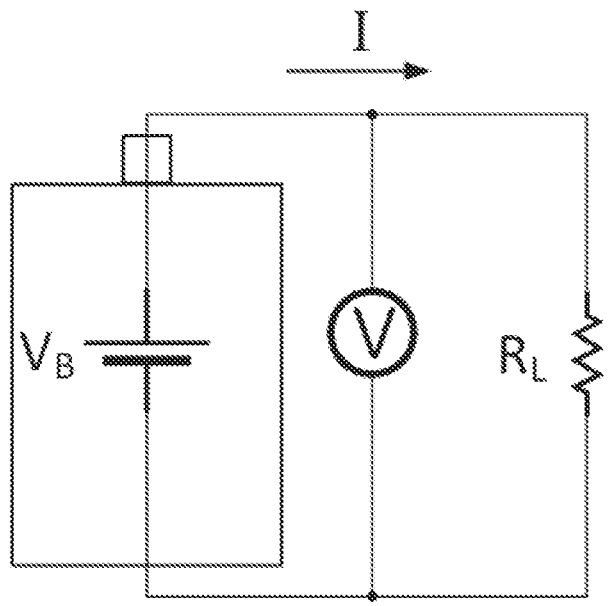
FIG. 1: Prior Art - Ideal voltage source connected to a load
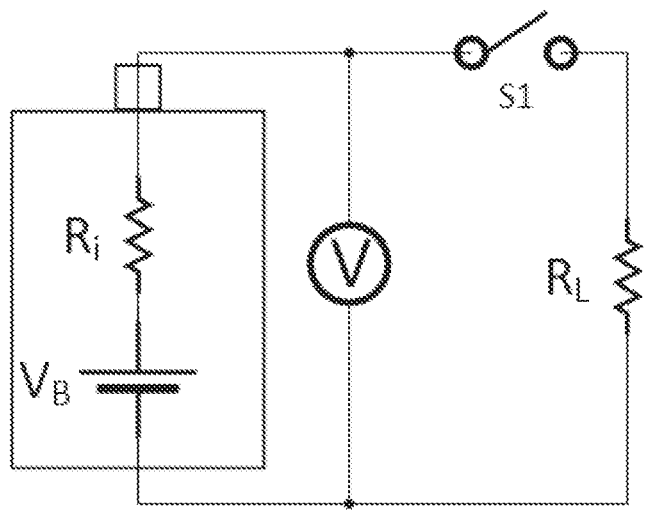
FIG. 2: Prior Art - Non-ideal voltage source disconnected from a load by an open switch

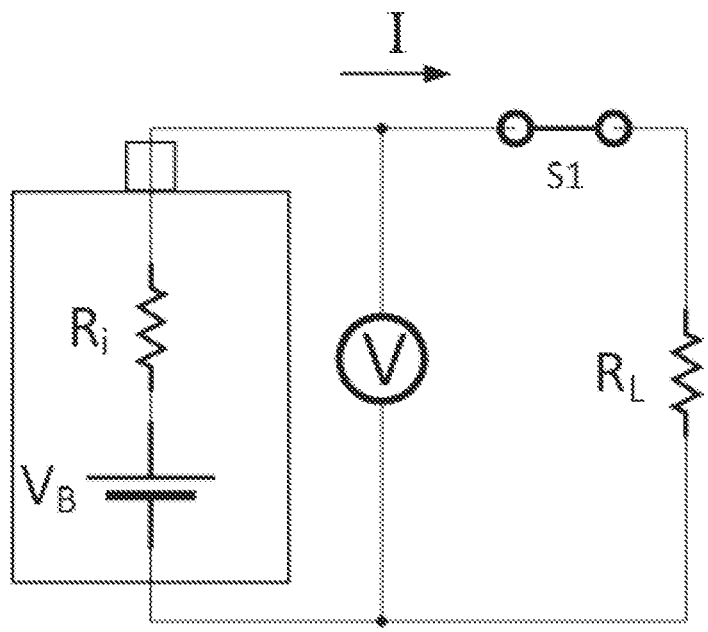
FIG. 3: Prior Art - Non-ideal voltage source connected to a load by a closed switch
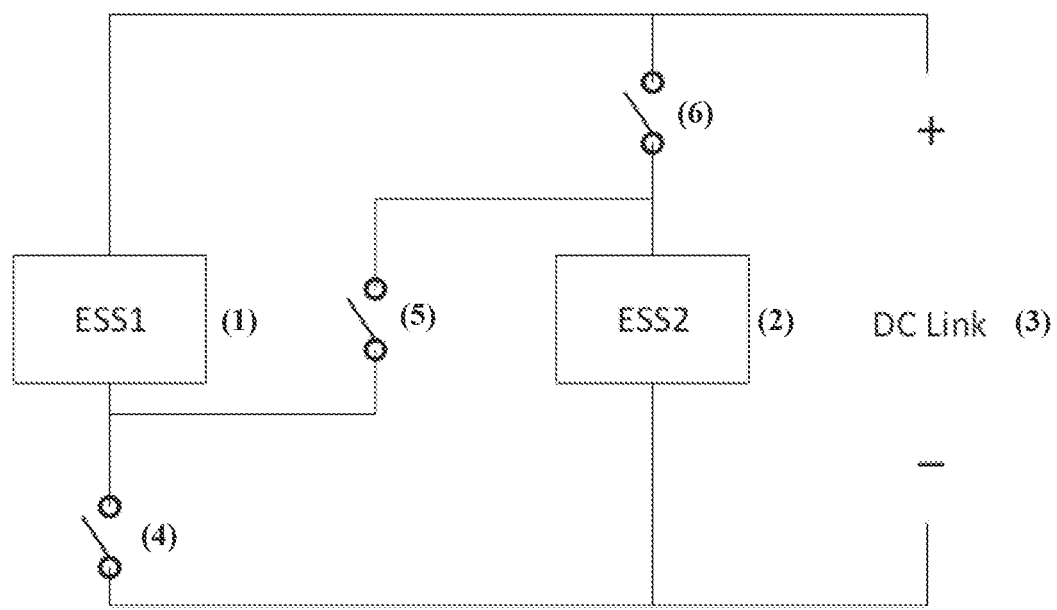
FIG. 4: Prior Art - Reconfigurable energy storage system

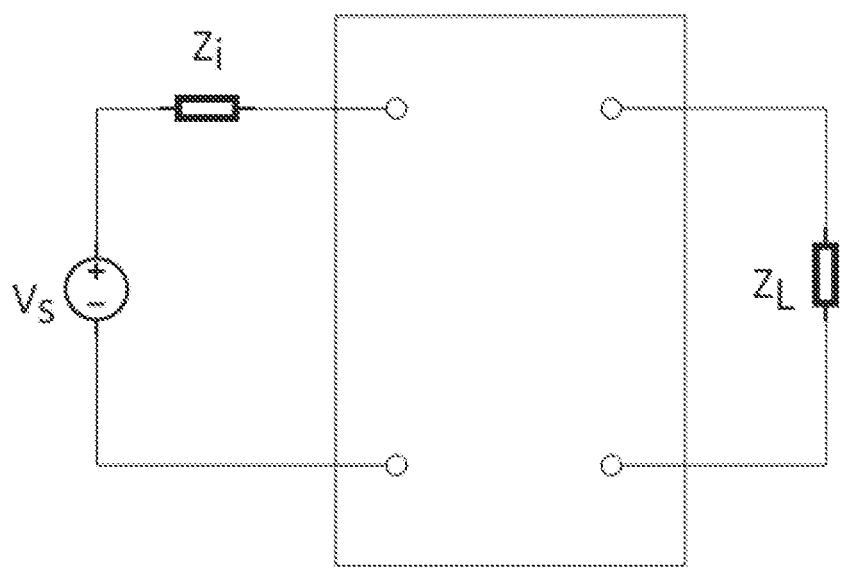
FIG. 5: Prior Art – A non-ideal voltage source disconnected from a load impedance
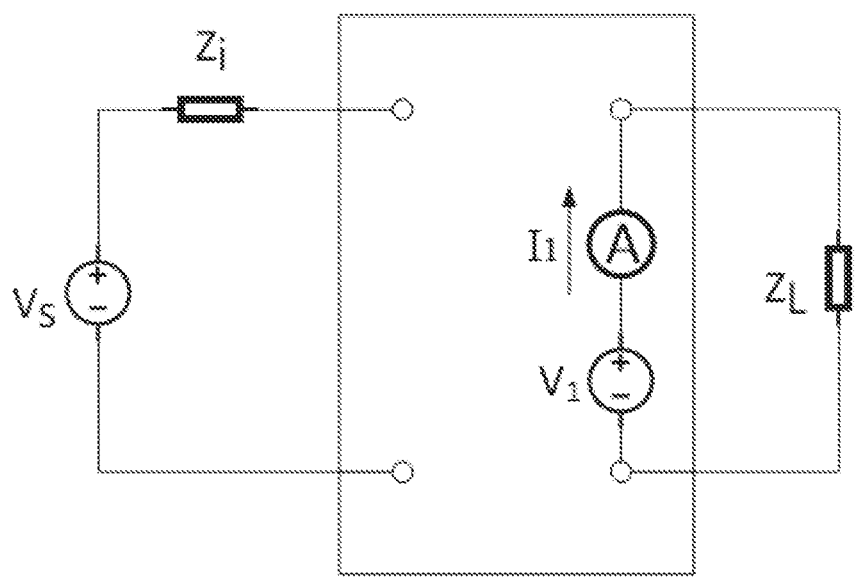
$$Z_L = V_1/I_1$$
FIG. 6: Prior Art - Determining the load impedance with a test voltage and an ammeter

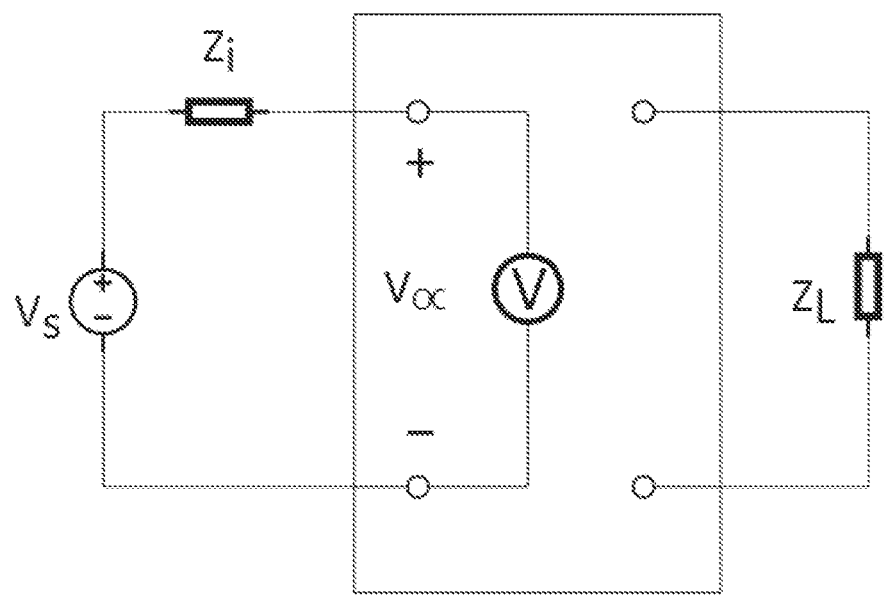
FIG. 7: Prior Art - Measuring open-circuit source voltage with a voltmeter

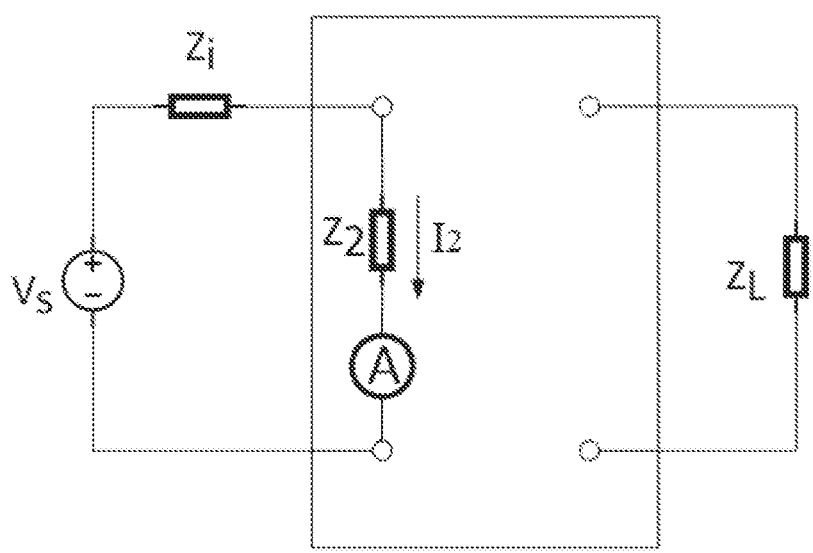
$$Z_i = (V_{OC}/I_2) - Z_2$$
FIG. 8: Prior Art - Determining source voltage by measuring a current through a test impedance and an ammeter

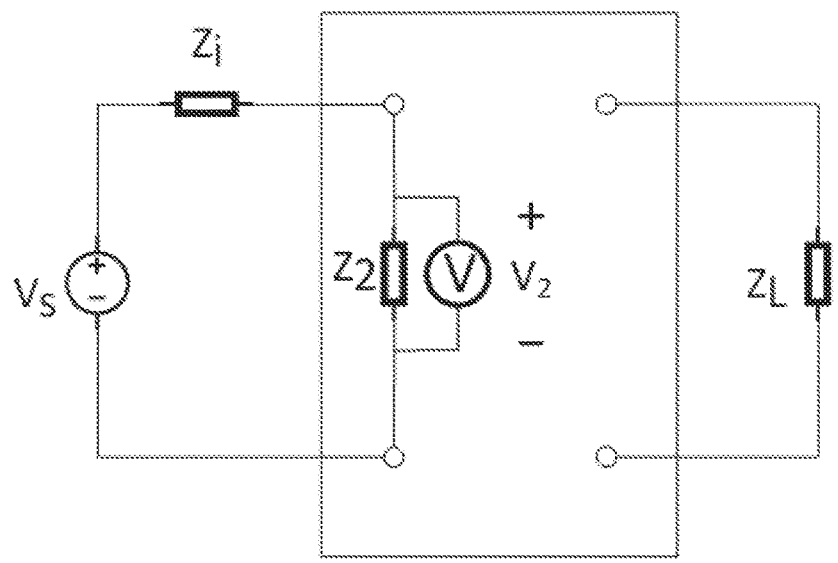
$$Z_i = V_{OC} * (Z_2/V_2) - Z_2$$
FIG. 9: Prior Art - Determining source voltage by measuring voltage across a test impedance using a voltmeter
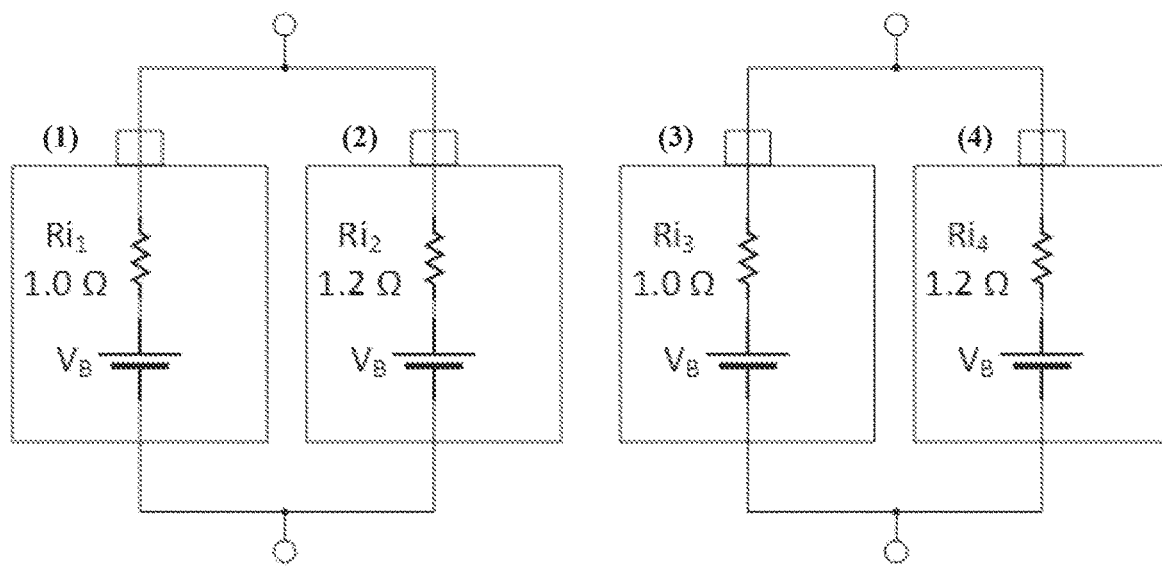
FIG. 10: Prior Art - Two pairs of cells with mismatched resistances

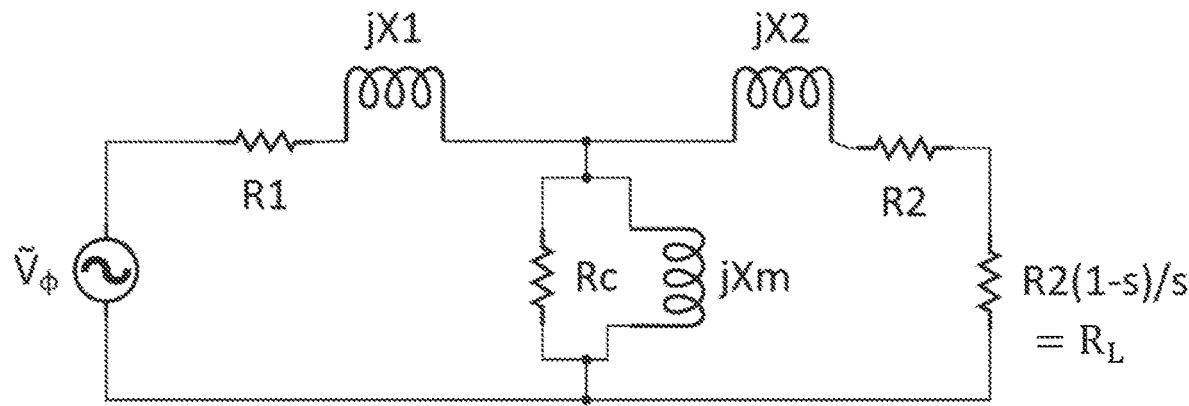
FIG. 11: Prior Art - Per-phase induction motor equivalent circuit
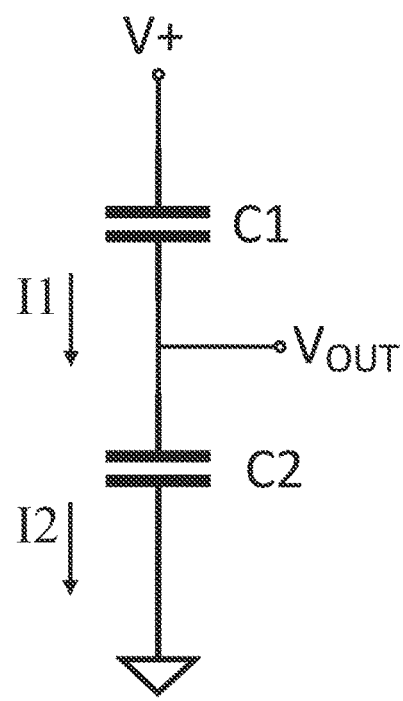
FIG. 12: Prior Art – Two supercapacitors stacked in series

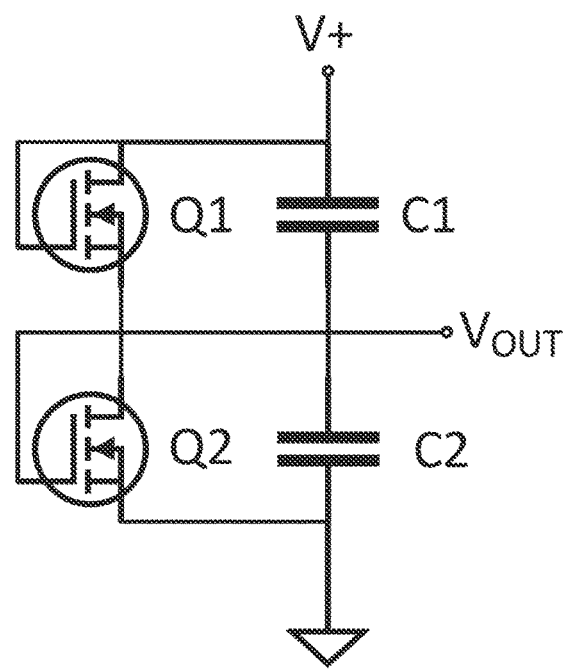
FIG. 13: Prior Art – Two supercapacitors stacked in series with auto-balancing MOSFETs

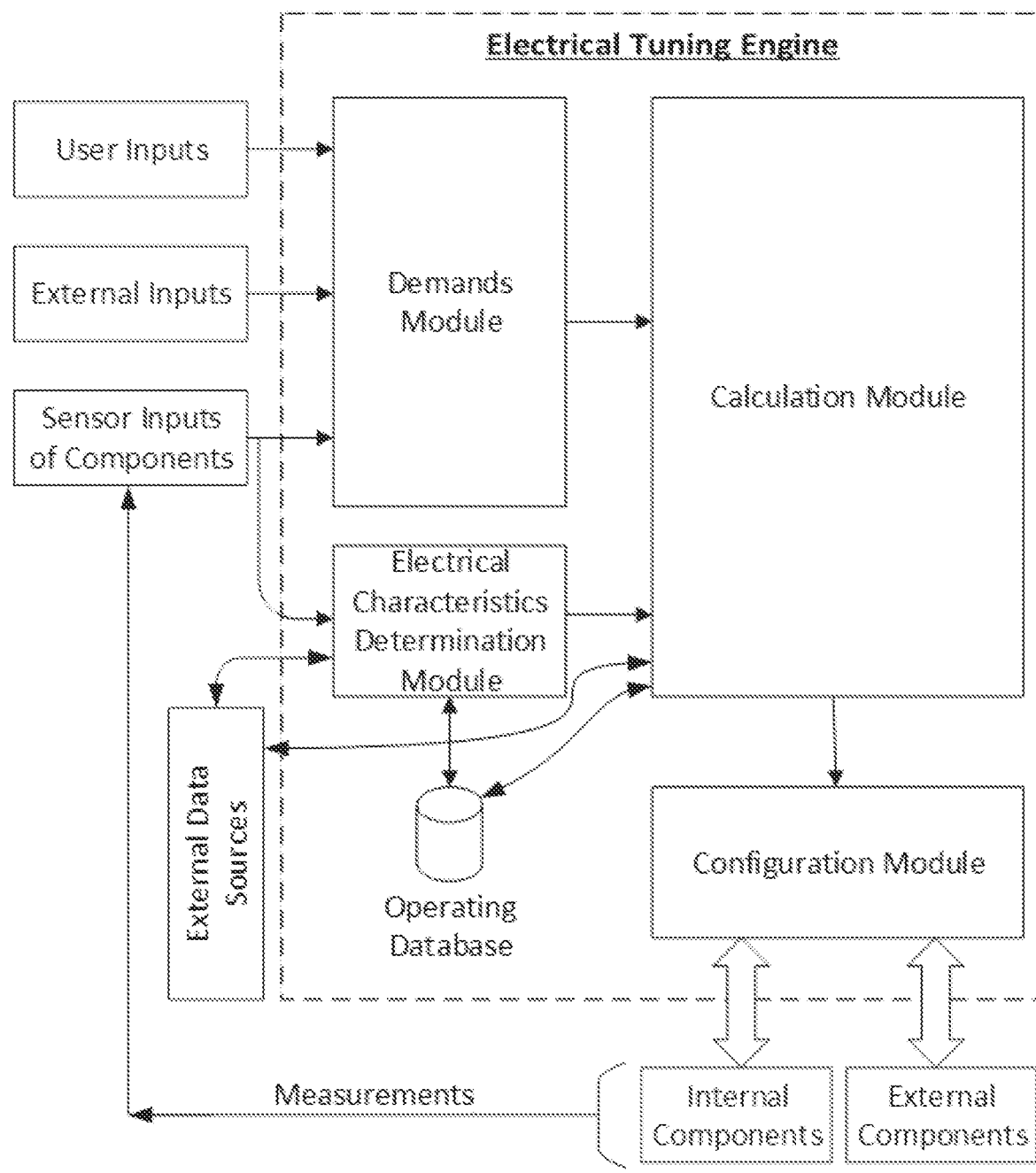
FIG. 14: Electrical Tuning Engine

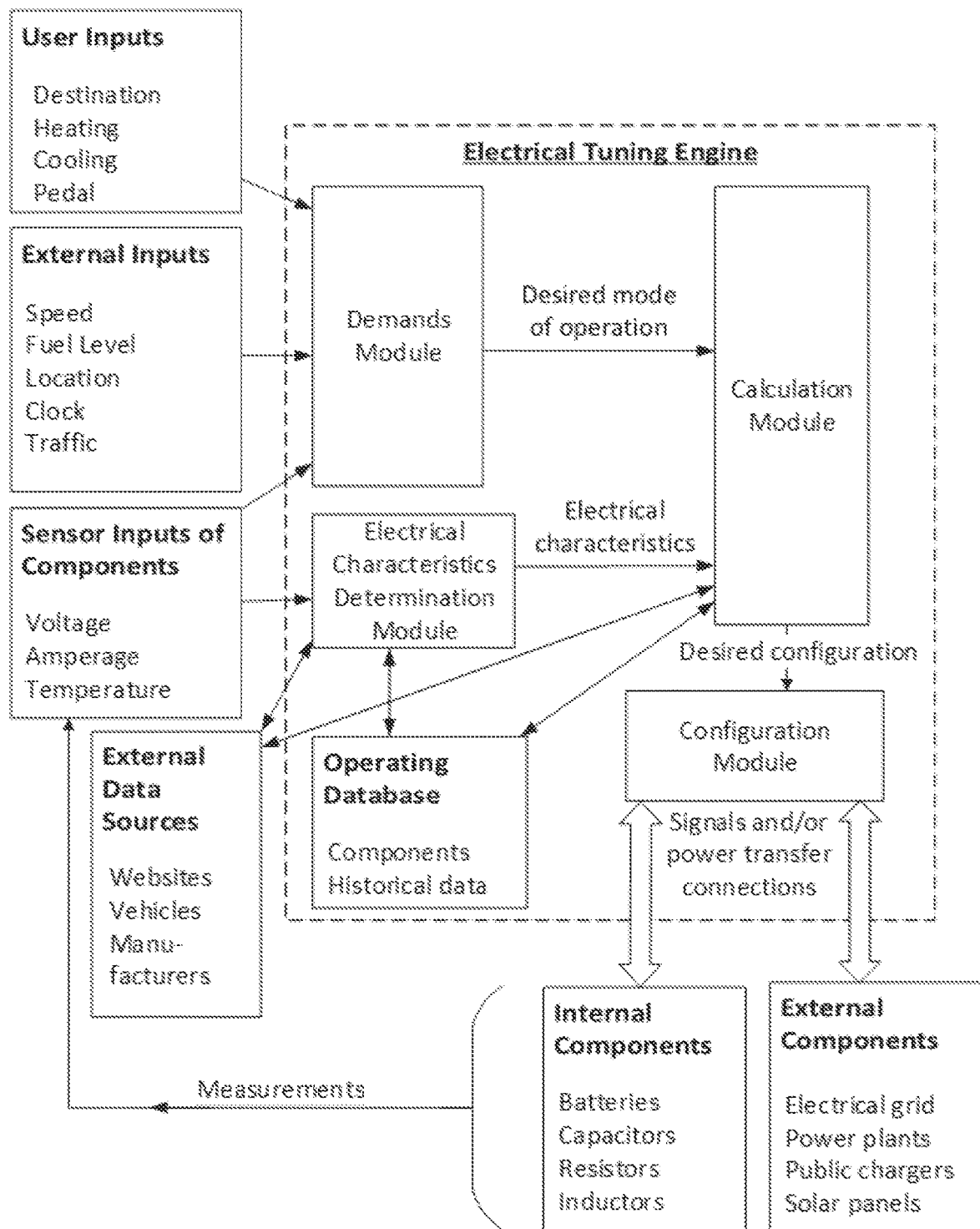
FIG. 15: Electrical Tuning Engine (detailed)

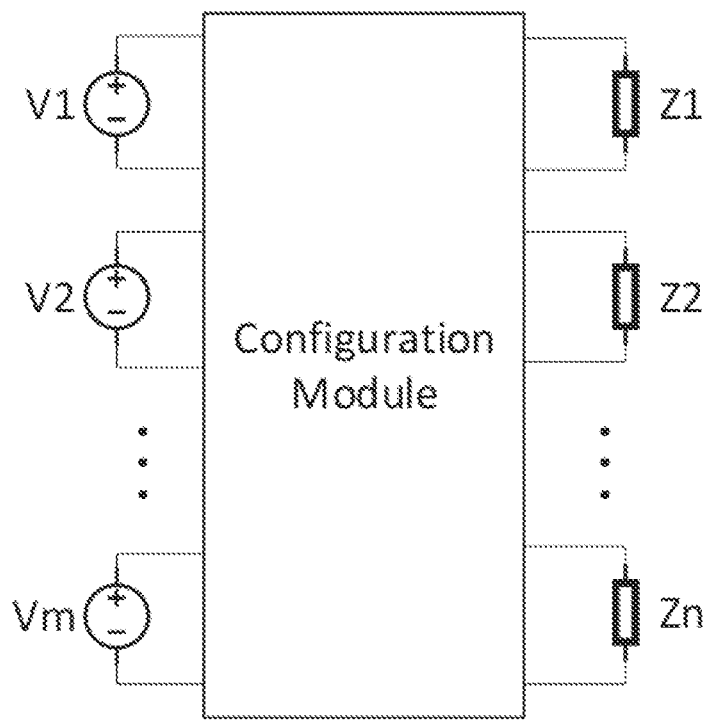
FIG. 16: Configuration module with multiple non-ideal sources and loads
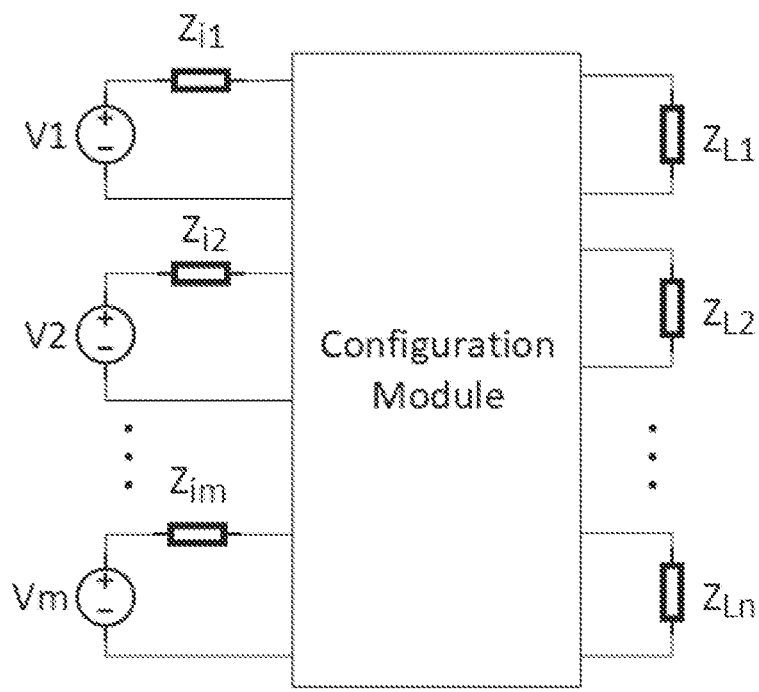
FIG. 17: FIG. 16 where sources $V_1$ through $V_m$ have Thevenin-equivalent internal impedances $Z_{i1}$ through $Z_{im}$

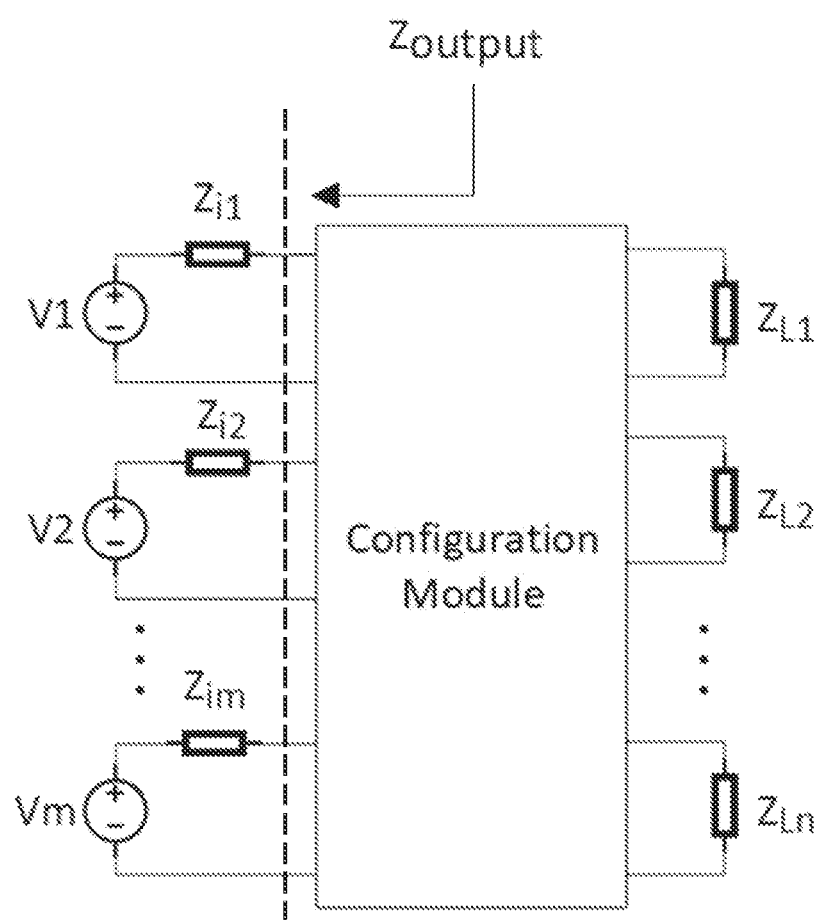
FIG. 18: Configuration module with an output impedance

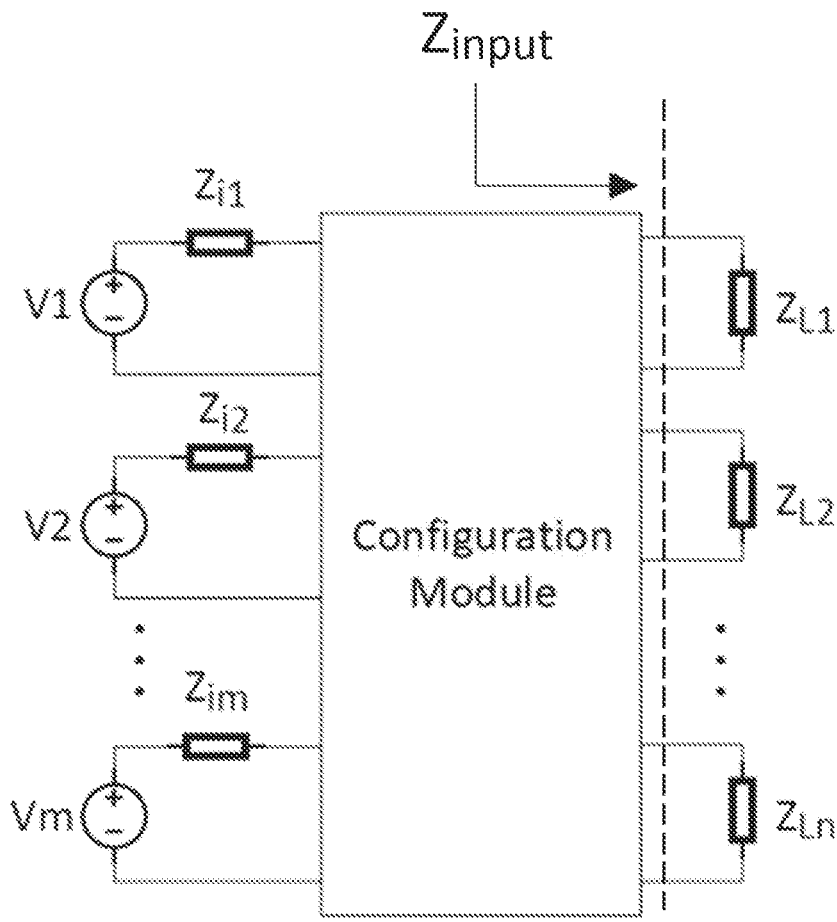
FIG. 19: Configuration module with an input impedance
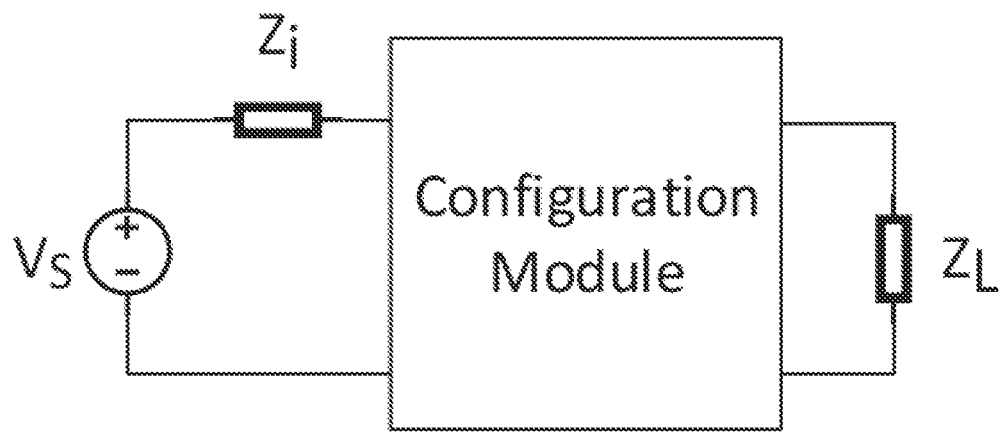
FIG. 20: Configuration module connected between a non-ideal voltage source and a load impedance

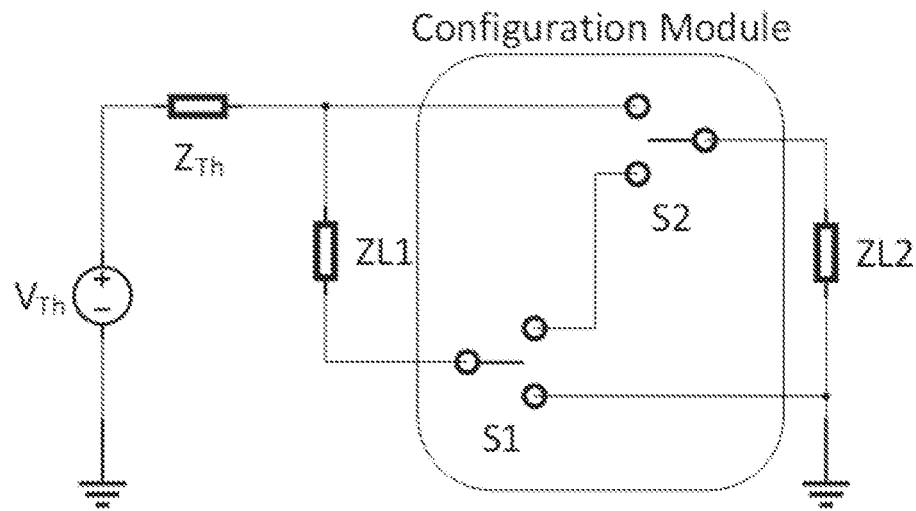
FIG. 21: Multiple impedances coupled to a configuration module
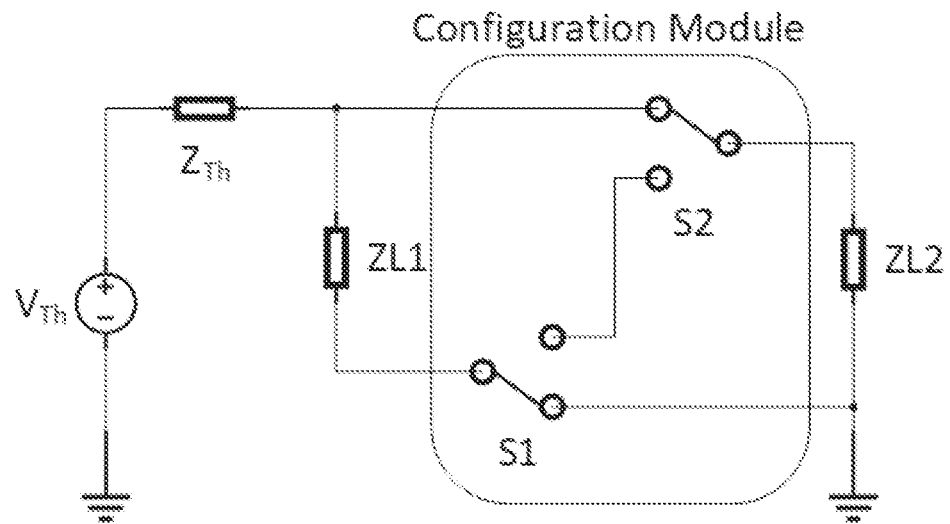
$$Z_{L,eq} = Z_{L1} || Z_{L2} = Z_{L1} * Z_{L2}/(Z_{L1} + Z_{L2})$$
FIG. 22: Multiple impedances connected to a configuration module in parallel forming an equivalent load impedance

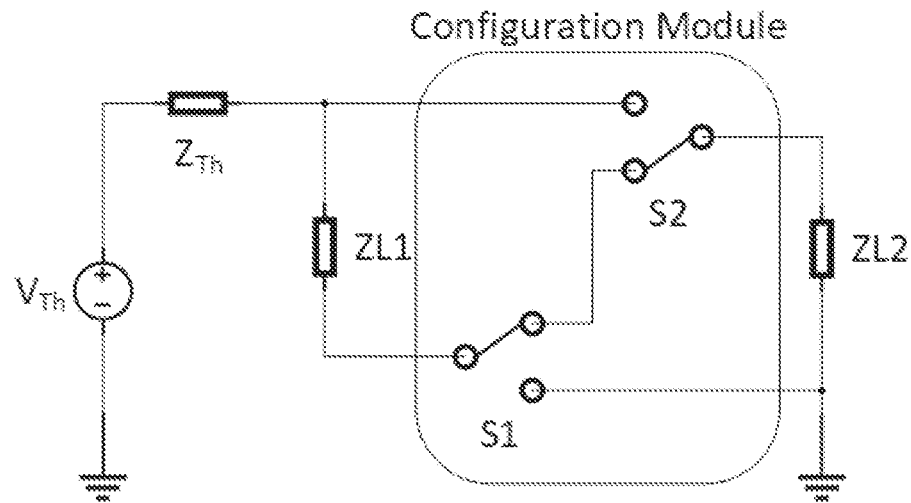
$$Z_{L,eq} = Z_{L1} + Z_{L2}$$
FIG. 23: Multiple impedances connected to a configuration module in series forming an equivalent load impedance.
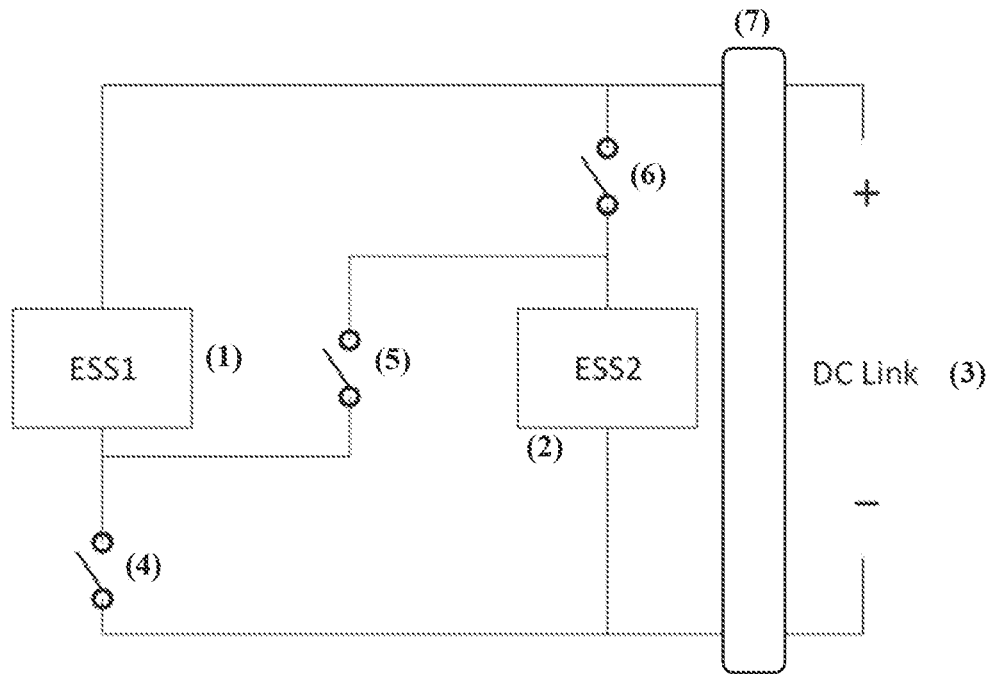
FIG. 24: Reconfigurable ESS from FIG. 4 with an electrical tuning engine connected between the ESSs and the DC Link.

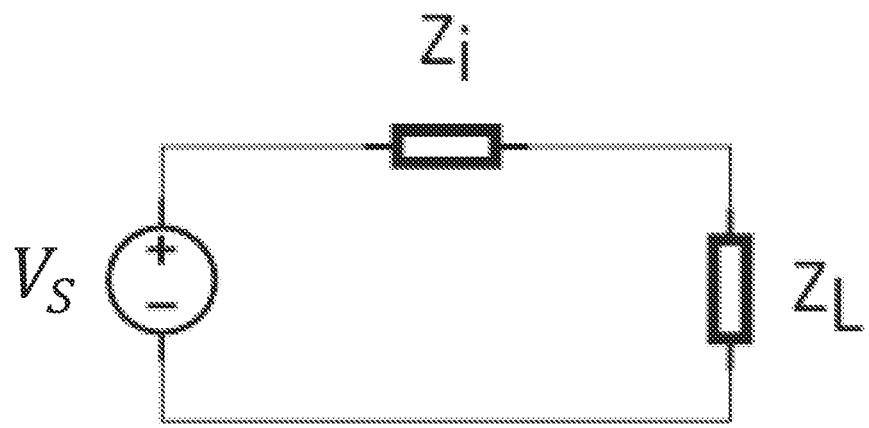
FIG. 25: Thevenin-equivalent circuit diagram of FIG. 24.
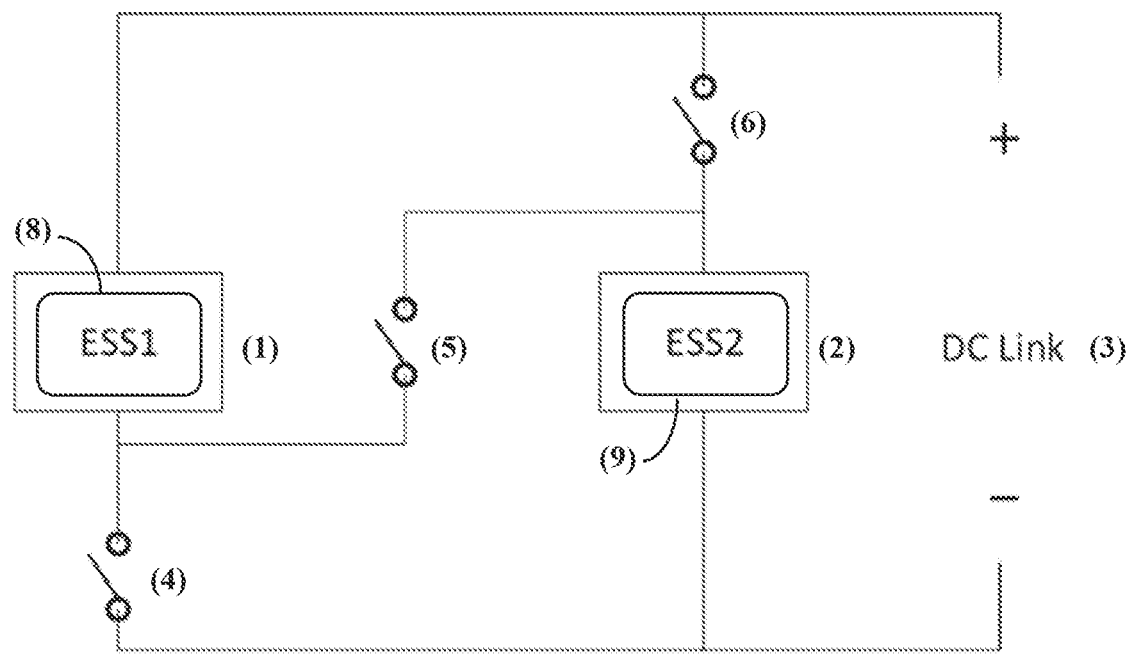
FIG. 26: FIG. 4 where ESS1 and ESS2 have internal ETEs (8) and (9)

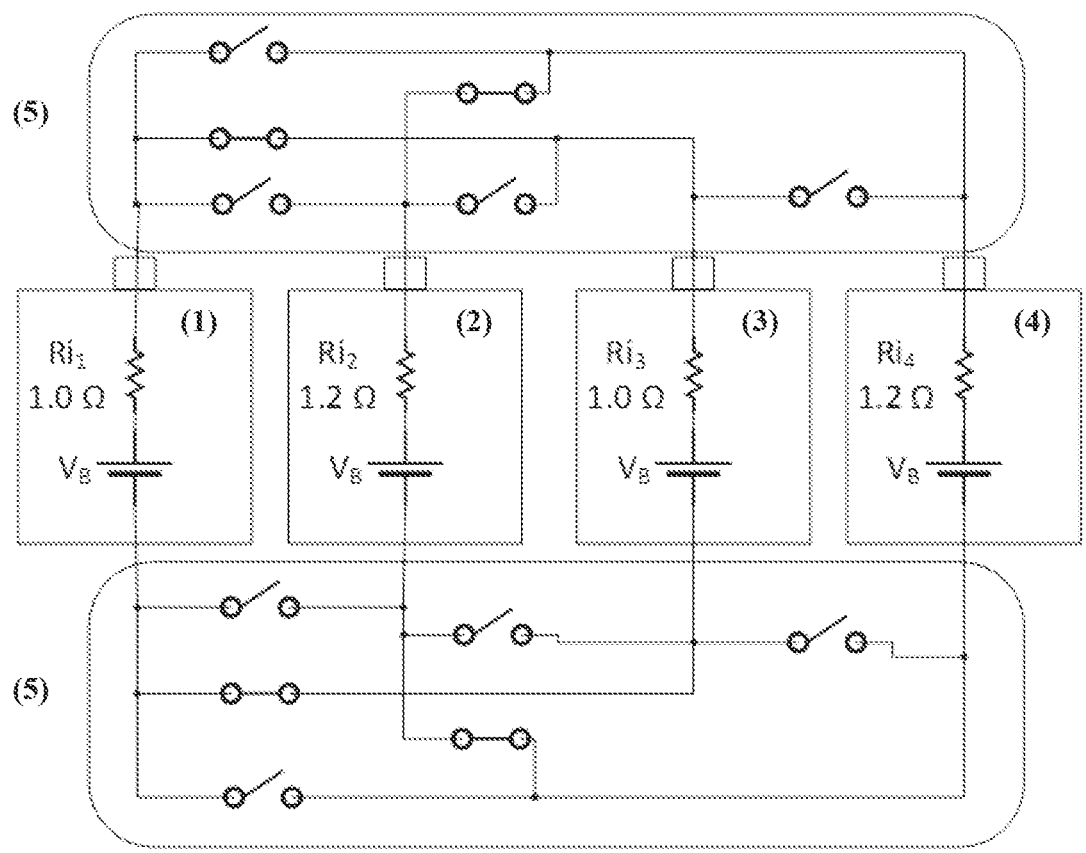
FIG. 27: Two pairs of cells with matched resistances

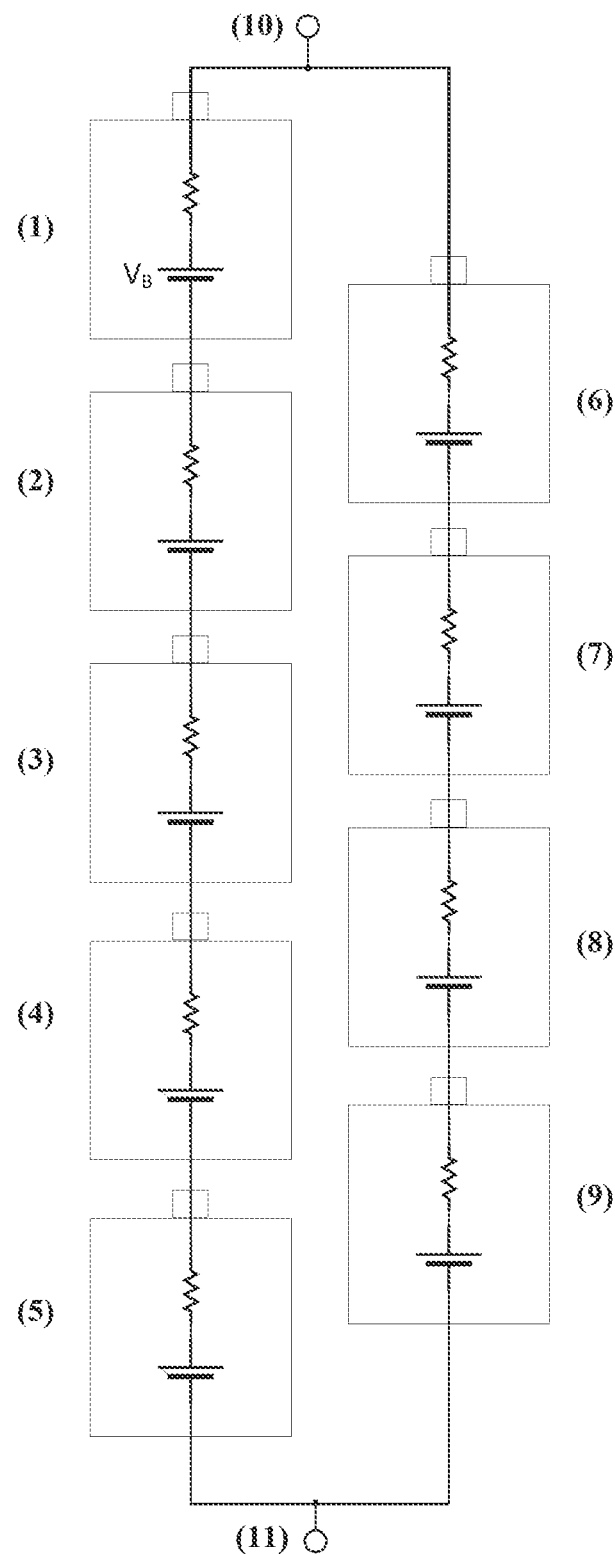
FIG. 28: Configuration of battery cells with internal resistances

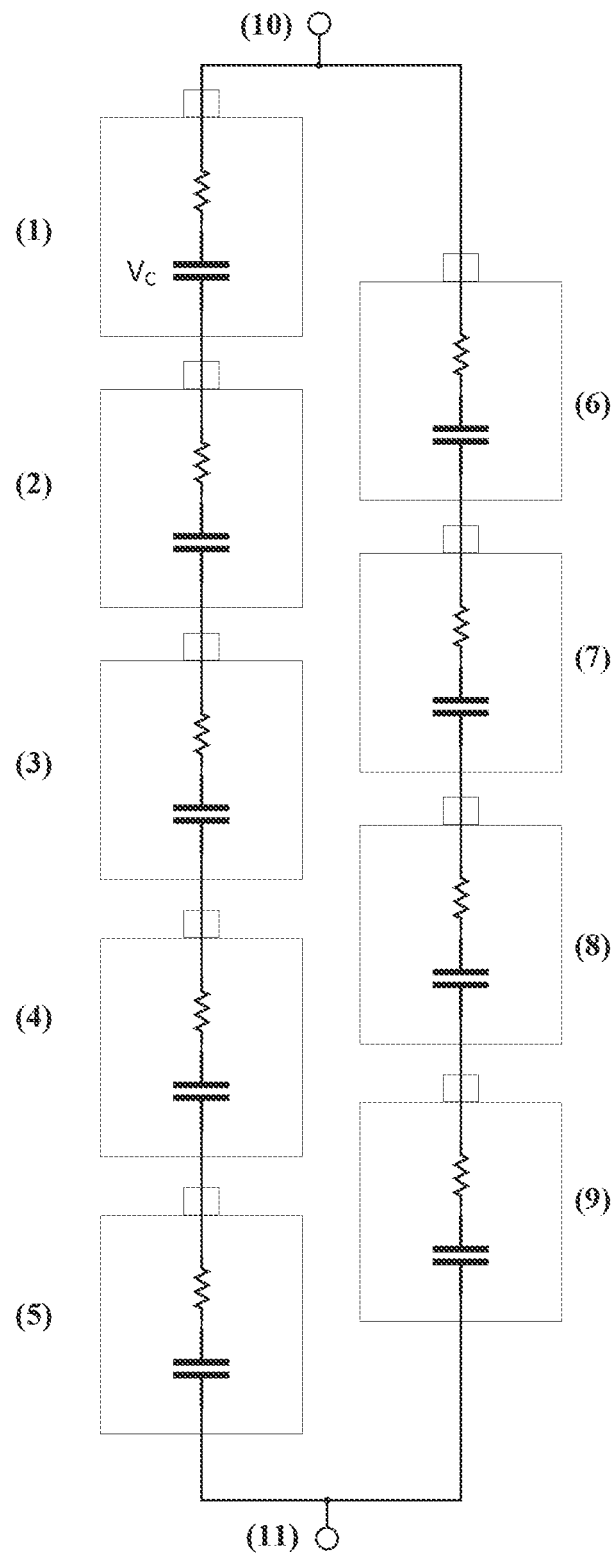
FIG. 29: Configuration of capacitors with internal resistances

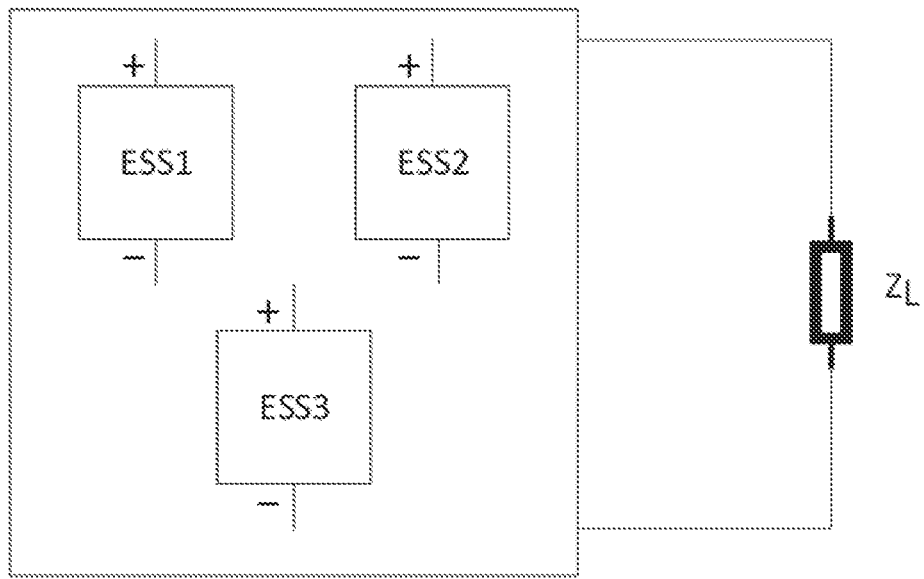
FIG. 30: Source consisting of multiple elements before reconfiguration, where a load impedance $Z_L$ is connected to the source
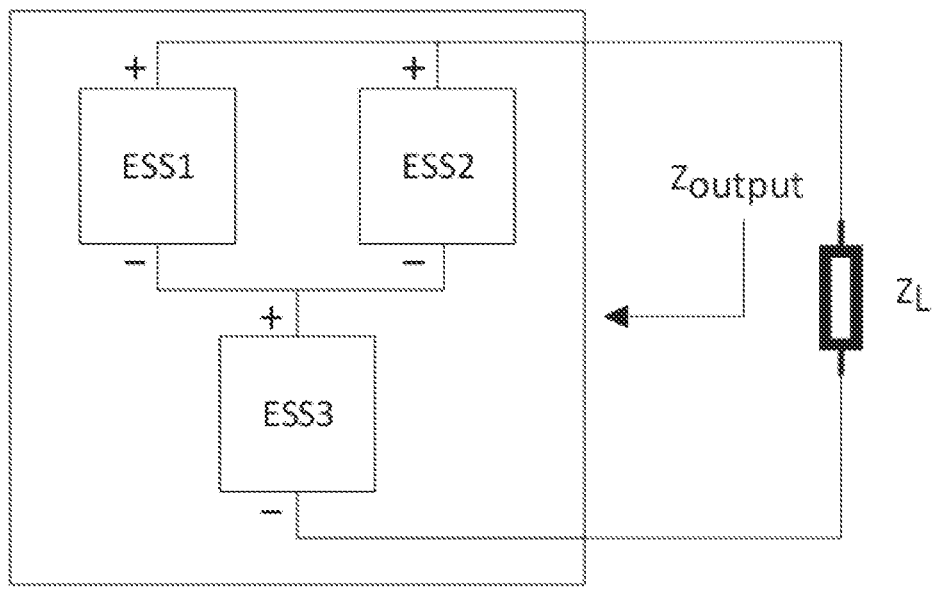
FIG. 31: Source consisting of multiple elements after reconfiguration, where a load impedance $Z_L$ is connected to the source

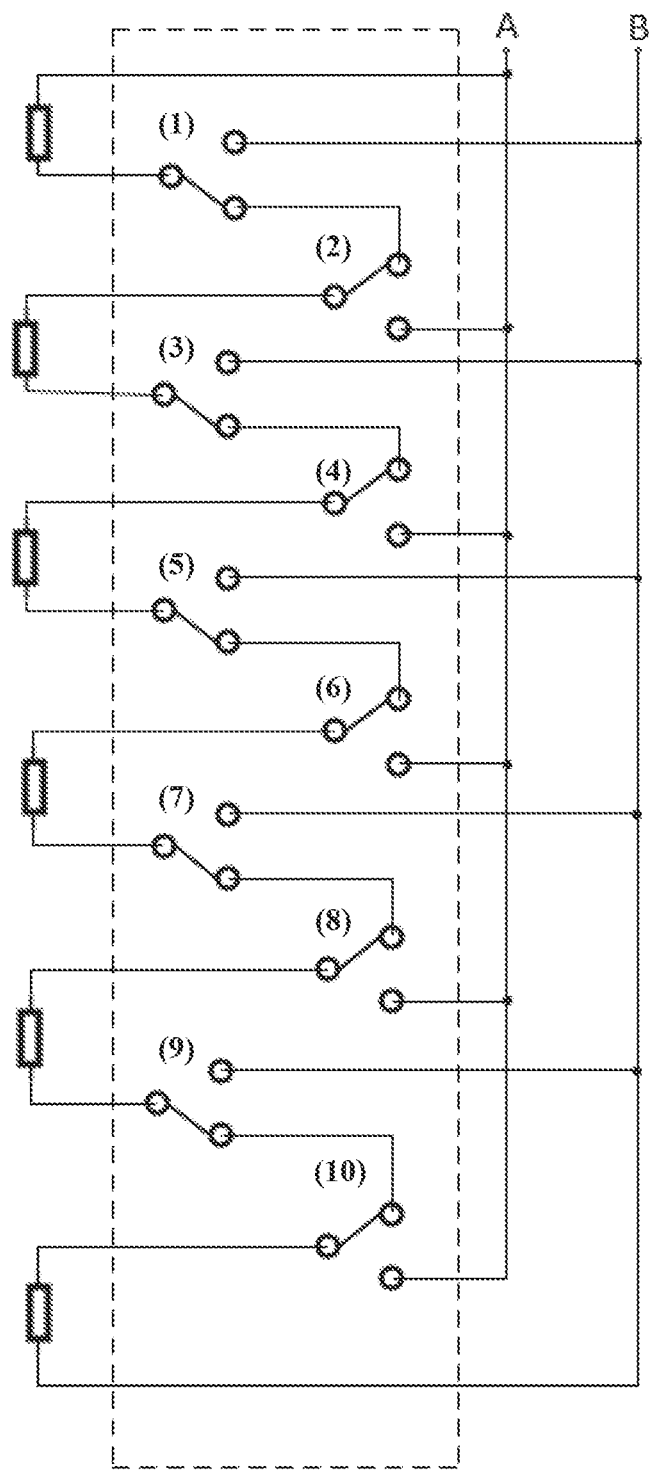
FIG. 32: Six components connected to a configuration module

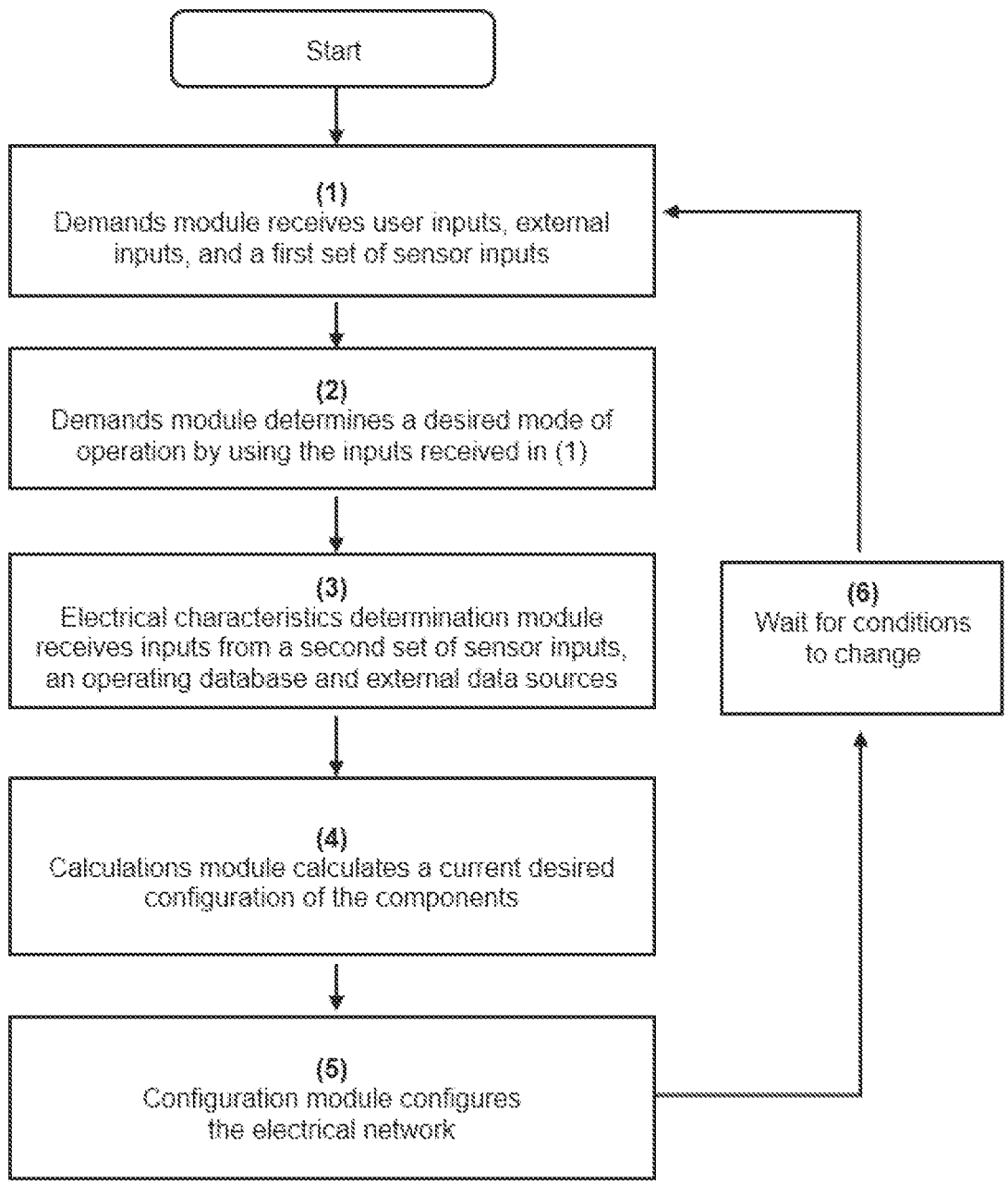
FIG. 33a: Flowchart for Electrical Tuning Engine

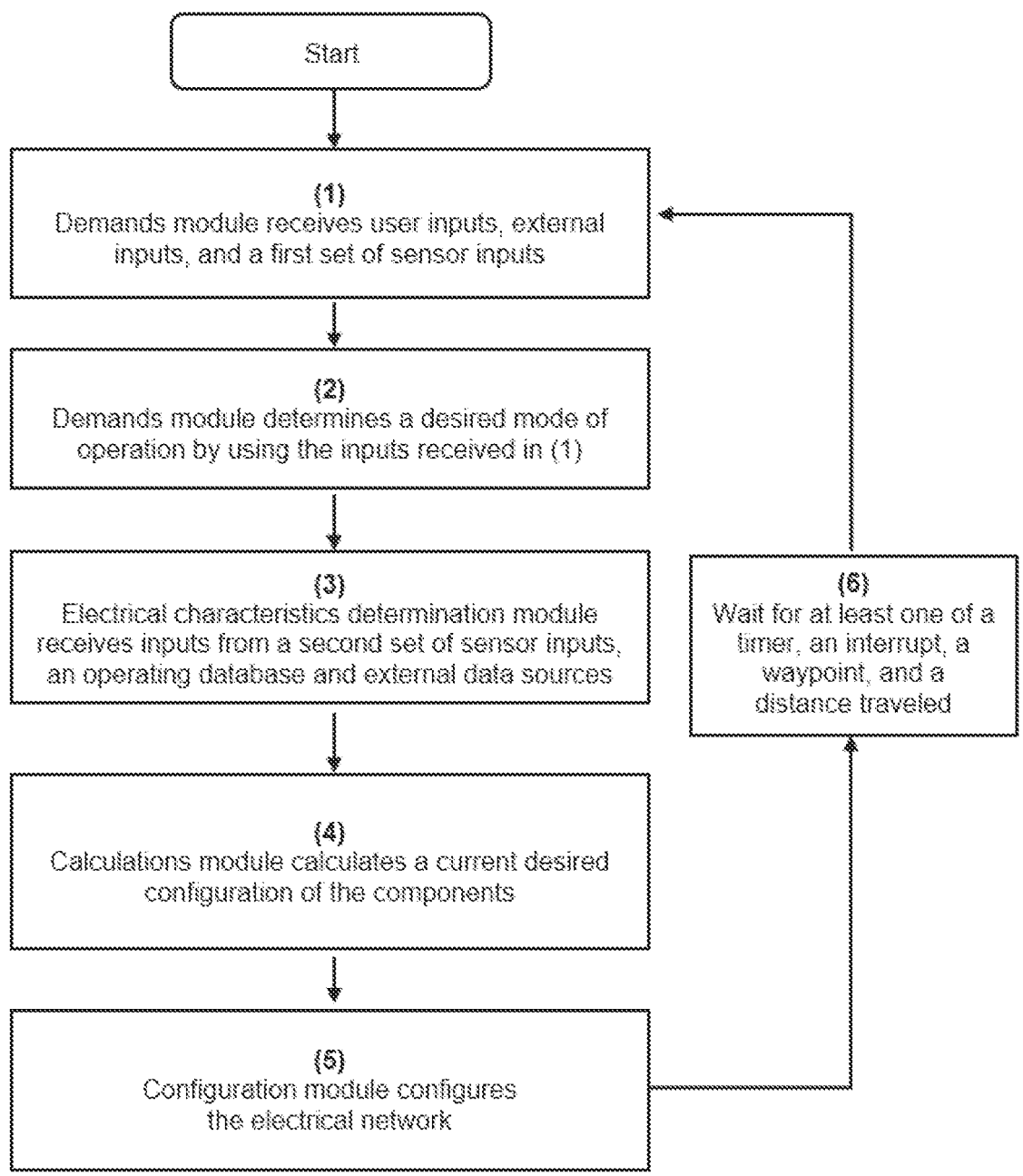
FIG. 33b: Flowchart for Electrical Tuning Engine

APPARATUS FOR RECONFIGURING INTERNAL POWER SOURCE AND LOAD IMPEDANCE ELEMENTS

CROSS-REFERENCE TO RELATED APPLICATIONS

This application is a continuation of U.S. Non-Provisional patent application Ser. No. 16/876,883 filed May 18, 2020, which is incorporated by reference herein.

This application claims priority to U.S. Provisional Patent Application No. 62/970,449 filed Feb. 5, 2020, which is incorporated by reference herein.

BACKGROUND OF THE INVENTION

1 History of Electric Vehicles (EVs)

According to Wikipedia and the Edison Tech Center, the first rotary electric motors were invented in the 1830s (https://en.wikipedia.org/wiki/Timeline_of_the_electric_motor. Accessed Jan. 28, 2020; https://edisontechcenter.org/ElectricCars.html. Accessed Jan. 28, 2020). Thomas Davenport built a motor in 1834 that would later drive a miniature railcar on a tabletop. The battery was not rechargeable, and it was too heavy for the railcar to pull. Over the next century, new inventions and improvements contributed to the commercial success of electric automobiles, a subset of EVs. A rechargeable lead-acid battery was invented in 1854, and a high-torque DC traction motor was invented in 1886. In 1890, the chemist William Morrison built the first electric automobile powered by his batteries.

By 1910, almost 40 percent of road vehicles were electric automobiles. They were the preferred automobile of cab service companies. Women living in cities also preferred driving them because they were easier to start than gas cars, which relied on hand cranks. Although the cars had a relatively short driving distance, they met the needs of owners living in dense cities. Owners could recharge their cars at home with new battery charging technology. Influential EV inventors of this time included William Morrison, Thomas Parker and Walter C. Baker. Parker was an inventor who built one of the first electric cars and contributed to battery technology. Baker sold electric cars with improvements like ball bearings and Vanadium steel axles. Various kinds of hybrid electric cars were sold during this time, too. They had an engine-generator which charged a battery that ran their electric motors.

Gas cars eventually became cheaper to drive than electric cars due to mass production and cheap oil. Improvements to gas cars made them even more appealing. Starter motors replaced hand cranks, and mufflers quieted the noisy engine. While gas car prices were falling, electric car prices continued to rise. Cities were expanding, and gasoline served as a more practical power source than electric batteries to cover longer distances. Electric automobiles subsequently faded out of interest for decades.

The oil crisis in the 1970s prompted some companies to start building EVs. The US government started funding research for better batteries. Meanwhile, computers became compact enough to fit inside vehicles. They helped to improve the efficiency of hybrid cars with computer-controlled systems.

2 Modern Electric Cars

Electric cars are a rapidly growing sector of the transportation industry. The main difference between gas and electric cars is the propulsion system. In a gas car, an internal combustion engine powers the wheels through the transmission and drivetrain. In contrast, an electric motor powers the wheels in an electric car. A motor converts power from an electrical source into rotary motion. Rechargeable batteries and engine-generators are the main sources of electricity for an electric car's motors.

Electric cars powered exclusively by batteries are called all-electric vehicles (AEVs). They are typically charged directly from the power grid through a connection port and can typically drive 150 to 250 miles per charge. Currently, some of the most popular models include the Nissan Leaf, Chevy Bolt, and Tesla Model 3. Hybrid electric cars have both a battery and an engine-generator, which can extend the range by over 250 miles. The Toyota Prius is a well-known hybrid. Most hybrids run only on gasoline, which fuels the engine-generator that provides the electricity. Plug-in hybrids (PHEVs) have both a fuel tank and an external charge port for charging the battery directly. They can run like an all-electric car until the battery is depleted and then switch to hybrid mode. These cars are meant for users whose typical driving distance falls within the 20-to-40-mile range of a small EV battery.

A Consumer Reports article titled "Electric Cars 101" (https://www.consumerreports.org/hybrids-evs/electric-cars-101-the-answers-to-all-your-ev-questions/. Accessed Jan. 28, 2020) explains why car buyers are going electric. Most EV owners like that their cars consume less resources than gas cars; an electric motor is much more efficient at converting stored energy into motion than is an internal combustion engine. Unless an engine-generator is running, an EV does not produce tailpipe emissions that pollute the air with smog. Another attractive feature is the lower cost of driving. According to Consumer Reports, "[Plug-in] electric cars offer significantly lower fuel costs compared to traditional, gas-powered cars. On average, a gallon of gasoline costs about twice as much as the comparable cost to run an electric car. That's especially true if drivers take advantage of off-peak electricity rates while charging at home. And electric rates tend to be more stable than oil prices." The electric motors in hybrids allow them to achieve high MPG. Federal and state tax incentives have promoted EV sales in the US, as has access to HOV lanes in certain states. AEVs require less maintenance than gas cars because they have fewer moving parts, and EV owners can charge at home instead of refueling at a gas station.

Currently, EV batteries are commonly charged at three voltage levels: Level 1 (120V), Level 2 (240V), and DC fast charge (480V). Owners most commonly charge their cars at 120V from a standard residential wall outlet. This voltage typically provides two to five miles of range per hour. Level 2 chargers typically provide ten to twenty miles of range per hour, and they are most commonly found at public charging stations and workplaces. Some EV owners install Level 2 outlets at home for faster charging. DC fast charging can provide 60 to 80 miles of range or more in 20 minutes. These chargers are almost exclusively located at public charging stations.

Most EVs commercially available in North America have a SAE J1772 connector that can charge the battery at Level 1 or Level 2. Exceptions include Tesla vehicles which have a proprietary connector capable of all charging levels, and adapters allow them to connect to J1772 plugs (J plugs). Only certain electric cars have DC fast charging connectors. While DC fast charge connectors come standard in all Tesla models and in the 2019 Hyundai Ionic Electric, they cost an additional $750 in the 2019 Chevrolet Bolt, and only the more expensive PLUS models of the Nissan Leaf have fast charging capabilities. Plug-in hybrids generally do not support fast charging because their small batteries can charge relatively quickly with a Level 2 charger. DC fast charging connectors differ from one manufacturer to another. North American cars usually have a combo connector called SAE J1772 CCS, and Japanese cars usually have a separate CHAdeMO connector.

EV travelers need reliable public charging stations, and numerous companies have started providing this service. ChargePoint is the biggest charging network, reaching 100,000 chargers worldwide in September 2019. ChargePoint is projected to reach 260,000 chargers by December 2021 and plans to reach 2.5 million by 2025. ChargePoint offers both Level 2 and DC Fast Charging. Tesla users can recharge at Level 2 Destination Charging stations and fast charge at Tesla Supercharger stations. They can also charge from any J1772 connector with an adapter. Other charging networks include EVgo, Blink, SemaConnect, and Electrify America.

According to the website PluginCars ("Ultimate Guide to Electric Car Charging Networks" (https://www.plugincars.com/ultimate-guide-electric-car-charging-networks-126530.html. Accessed Jan. 28, 2020) and "The Real Price of EV Public Charging" (https://www.plugincars.com/guide-to-public-charging-costs.html. Accessed Jan. 28, 2020)), the majority of Level 2 stations are free. They are hosted by businesses like hotels, restaurants and shopping centers trying to attract EV-driving customers. Other public chargers require EV users to pay, and companies are experimenting with different price strategies. Level 2 stations charge customers either by the minute or by the kilowatt-hour (kWh). Most AEVs can charge at 6 to 8 kW. Ignoring inefficiencies, every customer pays the same for per-kWh charging, but customers with faster chargers, which have higher power ratings, pay less per-kWh on per-minute pricing. DC fast charging stations often charge a one-time session fee. Membership fees may or may not be required to charge from certain networks. The cited PluginCars articles state that Level 2 public charging may cost slightly more than residential charging, and fast charging costs twice as much as residential charging.

EVs are hampered by the drawbacks of rechargeable batteries. Battery capacity significantly decreases in cold temperatures, which means all-electric range is shorter in cold weather. To maximize all-electric range, the Department of Energy (DOE) recommends using accessories and temperature controls wisely (https://www.energy.gov/eere/electricvehicles/maximizing-electric-cars-range-extreme-temperatures. Accessed Jan. 28, 2020). Heating the cabin when the EV is plugged in will preserve battery charge, as will using seat warmers instead of heat while driving. Any power the car uses to play the stereo, stream music, or charge mobile devices directly shortens its all-electric range, though these are often negligible when compared to heating and air conditioning. Most cars have an economy mode which limits acceleration, since fast acceleration consumes significant energy. Gentle braking activates the regenerative braking system. Hard braking activates the brake pads, which wastes recoverable energy and wears them out over time.

Electric cars come with unique dangers. Their high-voltage systems and large lithium-ion batteries are extremely dangerous and must be kept under control at all times, especially during a collision. EVs are much quieter than gas cars since they lack a noisy engine. Some EVs emit a noise at low speeds so that pedestrians will notice them.

The DOE page on electric car maintenance (https://www.energy.gov/eere/electricvehicles/electric-car-safety-maintenance-and-battery-life. Accessed Jan. 28, 2020) states, "In general, AEVs require less maintenance than conventional vehicles because there are usually fewer fluids (like oil and transmission fluid) to change and far fewer moving parts. In contrast, because PHEVs have gasoline engines, maintenance requirements for this system are similar to those in conventional vehicles." Most manufacturers offer 8-year/100,000-mile warranties on batteries.

2.1 Controller Area Network and Electronic Control Units

According to Wikipedia, a controller area network (CAN bus) allows the embedded systems within a vehicle to communicate without needing a host computer (https://en.wikipedia.org/wiki/CAN bus). Each system and subsystem is controlled by a dedicated electronic control unit (ECU) which usually consists of a microcontroller, memory, a sensor interface, a communications interface, and an actuator driver. There is usually an ECU dedicated to controlling each one of the engine, transmission, motorized doors, airbag deployment, cruise control, and battery management system.

2.2 Intelligent Vehicles

Much like phones, cars are getting smarter. Modern cars have Wi-Fi and LTE capabilities, and much research focuses on vehicle-to-infrastructure (V2I) and vehicle-to-vehicle (V2V) communication. Dedicated short-range communications (DSRC) are wireless communication channels reserved for automobiles which often work in the 5.9 GHz band with a range of 300 meters. Many new vehicles use computer vision to drive semi-automatously. Generally, the most advanced self-driving cars can detect anything a human driver can. Using cameras and other sensors, cars can detect and predict road inclination and curvature, weather, and traffic, and they can communicate that information over the Internet and to nearby cars.

2.3 Battery Technology

A battery consists of one or more cells that convert stored chemical energy into electrical energy through electrochemical reactions. According to Wikipedia (https://en.wikipedia.org/wiki/Electric battery. Accessed Jan. 28, 2020), there are two categories of batteries: primary and secondary. Primary batteries are not rechargeable because their electrochemical reaction cannot easily be reversed, and they are discarded when they cannot supply sufficient power. Alkaline batteries are a common type of primary battery. Secondary batteries are rechargeable because their electrochemical reaction can be reversed by applying a voltage to their terminals. Common types of secondary batteries include lead acid, lithium-ion (Li-ion), lithium-ion polymer (LiPo), and nickel metal hydride (NiMH). The most common battery types used in EVs today are lithium-ion and lithium-ion polymer. A vehicle's all-electric range, weight, and price depend on the number of cells in its battery pack.

Battery technology currently faces several problems, and they are not limited to the EV industry. Lithium-ion batteries are still quite expensive, costing hundreds of dollars per kWh. According to the American Physical Society (https://www.aps.org/publications/apsnews/201208/backpage.cfm. Accessed Jan. 29, 2020), the energy density of lithium-ion batteries is 100 times lower than gasoline. Lithium-ion batteries self-discharge quite rapidly, and their charge capacity drops in cold weather and with repeated use. Subjecting EV batteries to high power condition such as acceleration, fast charging, and regenerative braking shortens their lifespans. Additionally, the mining process of raw materials is plagued by human rights issues, including child labor in the Democratic Republic of Congo. According to the Union of Concerned Scientists (https://blog.ucsusa.org/josh-goldman/electric-vehicles-batteries-cobalt-and-rare-earth-metals. Accessed Jan. 28, 2020), as of 2017, forty thousand Congolese children mine cobalt under harsh conditions. The DRC supplies 50 to 60 percent of the world's cobalt supply for lithium-ion batteries. Since batteries are such a limiting factor for EV technology and widespread adoption of electric cars, the U.S. Department of Energy's Vehicle Technology Office is researching ways to improve them (https://www.energy.gov/eere/vehicles/batteries. Accessed Jan. 28, 2020). It has three main goals to make driving EVs as convenient and as accessible as driving gas cars:
1. Reduce the cost of electric vehicle batteries to less than $100/kWh, ultimately $80/kWh
2. Increase range of electric vehicles to 300 miles
3. Decrease charge time to 15 minutes or less.

Additionally, battery recycling can help keep hazardous materials out of landfills and alleviate demand for raw materials, according to the VTO's Alternative Fuels Data Center (https://afdc.energy.gov/vehicles/electric_batteries.html. Accessed Jan. 28, 2020).

Another problem with lithium-ion battery cells is that parallel cells must have similar internal resistances to avoid overheating. According to Gogoana et al. (https://www.sciencedirect.com/science/article/abs/pii/S0378775313009447. Accessed Jan. 28, 2020), at 4.5 Coulomb charge and discharge, a 20% internal resistance mismatch between two parallel cells reduces the lifetime of the pair by 40% when compared to cells with similar resistances. Both cells experience large currents and high temperatures.

2.3.1 History of Electric Batteries

The history of electric battery technology begins with the Voltaic pile in the late eighteenth century, according to the Wikipedia article about electric batteries. It was the first reliable source of continuous electric current and contributed to many scientific discoveries. Each electrochemical cell contained a copper cathode disc and a zinc anode disc separated by brine-soaked cloth or cardboard serving as the electrolyte. Multiple cells were piled vertically to form a Voltaic pile. The Daniell cell was invented in 1836 and greatly improved battery technology for industrial purposes like telegraph networks. Lead-acid batteries, invented in 1859, were the first secondary (rechargeable) cells, and they remain in use today. Although heavy, they are inexpensive and produce high currents. Lithium-ion batteries are a more recent invention, gaining commercial success in the 1970s. They are used in EVs and personal electronic devices, where energy density is more important than low-cost energy storage.

2.4 EV Circuit Introduction

An electric circuit transfers power from a source to a load. The source supplies a certain amount of power, which depends on its voltage and output current, and the load absorbs a certain amount of power, which depends on its impedance. Batteries and generators are some common power sources. Motors and lights are some common loads.

FIG. 1 shows a circuit with an ideal source that outputs its nominal voltage. The source delivers all of its output power to the load. Real sources are not ideal. They lose some power when pumping current from negative to positive terminals.

By an analytical technique called Thevenin's Theorem, a loss may be modeled as an internal impedance between a battery's positive terminal and a load's positive terminal. FIG. 2 and FIG. 3 show a circuit with a non-ideal battery and a load, separated by a switch. The battery is non-ideal because it has an internal impedance $R_i$, which is modeled by a resistor. Before closing the switch (FIG. 2), every conductor touching the battery's positive terminal acquires the same voltage. A voltmeter measures $V_B$ between the battery's terminals. Upon closing the switch (FIG. 3), current flows across the internal impedance and the DC motor. Here, a voltmeter measures $V_B(R_L/(R_L+R_i))$.

Engineers are often concerned with maximizing power transfer and efficiency. Maximum power transfer is attained by matching a source's internal impedance $Z_i$ and a load impedance $Z_L$. Maximum efficiency is attained by maximizing the ratio $P_L/P_i$, the ratio of the real power consumed by the load to the real power consumed by the internal impedance.

To keep track of power flowing through an electric car, it helps to classify components as strict sources, strict load, and reversible components. Strict sources always supply power and never consume it under normal operating conditions. Examples include engine-generators, hydrogen fuel cells, and photovoltaic solar panels. Strict loads always consume power and never supply it under normal operating conditions, such HVAC systems, on-board CPUs, sensors, lights, and stereos. Reversible components can either supply or consume power depending on the operating condition. For example, rechargeable batteries and ultracapacitors supply current while discharging, and they absorb current while recharging. Traction motors consume power while driving and generate power during regenerative braking. The power system of an EV may form many combinations of sources and loads over the course of a trip. The engine-generator may charge the battery, the battery may drive the motors, and the motors may regeneratively charge the battery.

FIGS. 5 through 9 demonstrate how to determine certain electrical characteristics. These methods are valid for both DC circuits and AC phasor circuits. FIG. 5 shows a non-ideal voltage source disconnected from a load impedance. The unknown characteristics are the load impedance $Z_L$, the voltage source $V_S$, and the internal impedance $Z_i$. To determine $Z_L$, a known test voltage $V_1$ is placed across the load's terminals, and the resulting current $I_1$ is measured with an ammeter (FIG. 6). Thus, $Z_L$ equals $V_1/I_1$. To determine $V_S$, a voltmeter is placed across the non-ideal load (FIG. 7). Assuming the voltmeter has an infinite impedance, $V_S$ equals the measured open-circuit voltage $V_{OC}$. To determine $Z_i$, a test impedance $Z_2$ is placed across the non-ideal voltage source, and the resulting current $I_2$ is measured with an ammeter (FIG. 8). Since $V_{OC}/I_2=Z_i+Z_2$, it follows that $Z_i=V_{OC}/I_2-Z_2$. An alternative way to determine $Z_i$ is by measuring the voltage $V_2$ across $Z_2$ (FIG. 9). The $I_2$ term is replaced by $V_2/Z_2$, which yields $Z_i=V_{OC}*(Z_2/V_2)-Z_2$.

Supercapacitors (SCs) are a promising energy storage technology for EVs because they can handle more power per unit of weight than lithium-ion-batteries can. Each SC cell often has a voltage rating of about 2.7 V, and they are stacked in series when a higher voltage is desired. One problem with stacking them in series is that leakage current from one cell can overcharge and damage other cells. A SC leaks current from its cathode, and the amount of leakage current increases with its voltage. FIG. 12 shows the prior art configuration of SCs C1 and C2 stacked in series with a voltage source $V^+$. C1 has a voltage $V_1=V^+-V_{OUT}$, and it leaks current $I_1$. C2 has a voltage $V_2=V_{OUT}$, and it leaks current $I_2$. If $I_1$ exceeds $I_2$, then more charge accumulates on C2's anode than leaves its cathode. Since $V_C \propto Q_C$ for a capacitor, and since leakage current increases with voltage, $V_2$ increases until $I_2$ matches $I_1$. C2 risks failure if $V_2$ exceeds the maximum voltage rating. Likewise, C1 risks failure if $I_2$ exceeds $I_1$. FIG. 13 shows a prior art configuration for two SC cells stacked in series with automatic balancing MOSFETs Q1 and Q2. This configuration prevents over-voltage because the MOSFETs provide safe paths for current to recharge the leakier cell. The configuration comes from the article "A New Method of Balancing Supercapacitors in Series Stack Using MOSFETs" by Advanced Linear Devices (mouser.com/pdfDocs/ALD_New_Method_Balancing_Supercapacitors.pdf. Accessed Jan. 28, 2020).

3 Prior Art for Component Reconfiguration and Impedance Readjustment

EVs achieve better efficiency and lower carbon emissions than gas-powered vehicles. To increase their efficiency and performance further, reconfigurable hybrid energy storage systems have been developed. These systems adjust the connections between energy storage components to meet a load requirement or absorb regenerative power. For example, U.S. Pat. No. 10,293,702 (the '702 patent) by Tu and Emadi describes a hybrid energy storage system (HESS) containing a rechargeable battery, an ultracapacitor, an engine-generator, and a DC link. Depending on the driving conditions and the load requirement, the HESS reconfigures two or more components in series, in parallel, or in series-parallel. Components may also be disconnected from the circuit. Tu's 2015 PhD thesis from McMaster University (https://pdfs.semanticscholar.org/a308/8e09ae7a4dae0eb9f249b2e5a2b91716821f.pdf. Accessed Jan. 28, 2020), which corresponds to the '702 patent, depicts in FIG. 4.5 several possible circuit configurations for a battery, an ultracapacitor, power electronic converters (PECs), and a load. The configurations are series, parallel, and versions of series-parallel. Table 4.1 ranks certain HESS configurations based on their power flow efficiency and their utilization of ultracapacitor energy. The HESS configurations in Tu's thesis do not account for the impedances of the source(s) and load(s).

Chinese Pat. No. 102,222,967 describes an inductive wireless EV charger that continuously monitors and adjusts the number of turns in the secondary coil to match the input/output impedance.

U.S. Pat. No. 2,745,067 (the '067 patent) by True et al. describes an invention that automatically matches the magnitude and phase angle of one component to a second component with a known impedance. The first component may be an antenna, and the second component may be a transmitter. The '067 patent states, "This invention is not limited to use with either transmitters or antennas. This system may be adapted for use in any A. C circuit. For example, commercial power lines may have their power factors automatically controlled by an embodiment of this invention. Another adaptation of this device is to control the impedance of a dielectric heating device such as disclosed by R. H. Hagopian in the December 1950 issue of Electronics on page 98." The signals in the '067 are analog and the switching components are mechanical. This invention only works with AC signals.

Power sources with varying output power such as photovoltaic cells use maximum power point tracking to ensure the source transfers maximum power to the load regardless of operating conditions. A power converter such as a buck converter can control the ratio of the output-to-input impedance by adjusting the duty ratio of the converter. A Wikipedia article about buck converters (https://en.wikipedia.org/wikiBuck_converter. Accessed Jan. 28, 2020) states, "this is particularly useful in applications where the impedance(s) are dynamically changing."

4 Summary of Needs

The prior art does not account for dynamic electrical characteristics tuning, wherein the electrical characteristics of the components are continuously changing along with desired modes of operation. What is needed is an automated method for reconfiguring an electrical configuration of a plurality of components of an electrical network associated with a vehicle in order to tune electrical characteristics of the electrical network to continuously match a dynamically changing desired mode of operation of the electrical network associated with the vehicle. The method should optimize the electrical characteristics to attain desired performance, efficiency, power, longevity, and other parameters.

Definitions

The following definitions describe the use of certain terms in this specification. They are hierarchically ordered in that each definition builds on previous definitions.

Element—A physical or abstract part of an electrical circuit. An element may consist of one or more elements. Examples include batteries, supercapacitors, motors, generators, and impedances.

Component—See "element"

Electric Vehicle (EV)—An electric vehicle uses electricity from a battery, generator, solar cell, fuel cell, or other source of electricity to power, at least in part, the locomotion of a vehicle that can transport a load. The vehicle could be an automobile, locomotive, golf cart, mining train, forklift, robot, or other device. The locomotion is usually provided by rotary electric motors but could also be provided from linear motors, solenoids, or any other type of electrostatic or electromagnetic device. A spacecraft propelled by ion thrusters is a specialized type of electric vehicle. The spacecraft achieves acceleration by ejecting a stream of ions accelerated across a potential difference away from the desired direction of motion.

Electrical Tuning Engine (ETE)—An ETE receives inputs about an electrical system and automatically reconfigures it to meet certain demands.

Impedance matching—Refers to making a source impedance equal the complex conjugate of a load impedance in order to maximize real power transferred from the source to the load.

Impedance pairing—Refers to adjusting the ratio of a source impedance to a load impedance in order to transfer a desired amount of power.

SC or UC— Supercapacitor or Ultracapacitor

Energy Storage System (ESS)—Any device or component which stores energy within an electrical system. Examples include batteries, SCs, and engine-generators. The device may be electrostatic, electromagnetic, electrochemical, electromechanical, etc.

Hybrid Energy Storage Systems (HESS)—A reconfigurable electrical system consisting of multiple types of ESSs.

Strict Source—An electrical component which supplies power but never consumes it under normal operating conditions.

Strict Load—An electrical component which consumes power but never supplies it under normal operating conditions.

Reversible Component—An electrical component which supplies power under some operating conditions and consumes power under other operating conditions.

BRIEF DESCRIPTION OF THE DRAWINGS

The foregoing summary as well as the following detailed description of preferred embodiments of the invention will be better understood when read in conjunction with the appended drawings. For the purpose of illustrating the invention, the drawings show presently preferred embodiments. However, the invention is not limited to the precise arrangements and instrumentalities shown. In the drawings:

FIG. 1 shows the prior art configuration for an ideal battery with a voltage $V_B$ connected to a resistive load $R_L$. A voltmeter measures a voltage equal to $V_B$.

FIG. 2 shows the prior art configuration for a non-ideal battery with a voltage $V_B$ and a purely resistive internal impedance $R_i$. The battery is disconnected from a purely resistive load impedance $R_L$ by an open switch. A voltmeter measures a voltage equal to $V_B$.

FIG. 3 shows the prior art configuration for a non-ideal battery with voltage $V_B$ and a purely resistive internal impedance $R_i$ connected to a purely resistive load impedance $R_L$ by a closed switch. A voltmeter measures a voltage equal to $V_B(R_L/(R_i+R_L))$.

FIG. 4 shows the prior art configuration for a reconfigurable HESS from the '702 patent.

FIG. 5 shows the prior art configuration of a non-ideal voltage source disconnected from a load impedance.

FIG. 6 shows the prior art configuration for determining an unknown load impedance $Z_L$. A known voltage $V_1$ is supplied across the load's terminals, and a resulting current $I_1$ is measured with an ammeter. The load impedance may be determined by calculating $Z_L = V_1/I_1$.

FIG. 7 shows the prior art configuration for determining an unknown voltage source $V_S$ by measuring an open-circuit voltage $V_{OC}$. The voltage source also has an unknown Thevenin-equivalent internal impedance $Z_i$.

FIG. 8 shows the prior art configuration for determining $Z_i$ from FIG. 7 by placing a test impedance $Z_2$ across the source's terminals, measuring a resulting current $I_2$, and calculating $Z_i = (V_{OC}/I_2) - Z_2$.

FIG. 9 shows the prior art configuration for determining $Z_i$ from FIG. 7 by placing a test impedance $Z_2$ across the source's terminals, measuring the voltage $V_2$ across $Z_2$, and calculating $Z_i = V_{OC}*(Z_2/V_2) - Z_2$.

FIG. 10 shows the prior art configuration for two pairs of parallel battery cells with mismatched internal resistances. Cells (1) and (2) form the first pair, and cells (3) and (4) form the second pair. Cells (1) and (3) have internal resistances of 1.0Ω, and cells (2) and (4) have internal resistances of 1.2Ω. All batteries have the same voltage $V_B$.

FIG. 11 shows the prior art model for a constant air-gap induction motor equivalent circuit. The electrical load $R_L$ represents the mechanical load of the rotor.

FIG. 12 shows the prior art configuration for two supercapacitors stacked in series.

FIG. 13 shows the prior art configuration for two supercapacitors stacked in series with auto-balancing MOSFETs.

FIG. 14 shows an Electrical Tuning Engine in accordance with one preferred embodiment of the present invention.

FIG. 15 shows the Electrical Tuning Engine of FIG. 14 in greater detail.

FIG. 16 shows a configuration module with multiple voltage sources and multiple load impedances.

FIG. 17 shows the configuration in FIG. 16 where the internal source impedances are shown explicitly.

FIG. 18 shows the configuration module from FIG. 17 where the non-ideal sources constitute an output impedance stage.

FIG. 19 shows the configuration module from FIG. 17 where the load impedances constitute an input impedance stage.

FIG. 20 shows a configuration module with a single voltage source $V_S$ with internal impedance $Z_i$ and a single load impedance $Z_L$.

FIG. 21 shows a configuration module where a Thevenin voltage source $V_{Th}$ with Thevenin impedance $Z_{Th}$ is connected to one side and two load impedances $Z_{L1}$ and $Z_{L2}$ are connected to the other side. Switches S1 and S2 are single-pole double-throw, but they are shown here in a neutral position for sake of demonstration.

FIG. 22 shows the configuration module from FIG. 21 where the load impedances $Z_{L1}$ and $Z_{L2}$ are configured in parallel. The equivalent load impedance $Z_{L,eq}$ is $$Z_{L1} \| Z_{L2} = Z_{L1}*Z_{L2}/(Z_{L1}+Z_{L2})$$

FIG. 23 shows the configuration module from FIG. 21 where the load impedances $Z_{L1}$ and $Z_{L2}$ are configured in series. The equivalent load impedance $Z_{L,eq}$ is $Z_{L1}+Z_{L2}$.

FIG. 24 shows the reconfigurable ESS from FIG. 4 with an electrical tuning engine connected between the ESSs and the DC link.

FIG. 25 shows a Thevenin-equivalent circuit diagram of FIG. 24.

FIG. 26 shows the reconfigurable ESS from FIG. 4 where electrical tuning engines (8) and (9) are embedded within ESS1 and ESS2.

FIG. 27 shows the configuration from FIG. 10 where a configuration module (5) has paired cells of matching impedances in parallel.

FIG. 28 shows a configuration of battery cells where a series of five cells is connected in parallel with a series of four cells.

FIG. 29 shows a configuration of capacitors where a series of five capacitors is connected in parallel with a series of four capacitors.

FIG. 30 shows a source consisting of multiple elements before reconfiguration, where a load impedance is connected to the source.

FIG. 31 shows a source consisting of multiple elements after reconfiguration, where a load impedance is connected to the source.

FIG. 32 shows six components connected to a configuration module.

FIGS. 33a and 33b show flowcharts for the method of determining a mode of operation and configuring the internal elements.

DETAILED DESCRIPTION OF THE INVENTION

Certain terminology is used herein for convenience only and is not to be taken as a limitation on the present invention. The words "a" and "an", as used in the claims and in the corresponding portions of the specification, mean "at least one."

5 Purpose of the Invention

Power in electric cars usually flows from large lithium-ion batteries through a controller to traction motors. Power transfer depends on the electrical characteristics of the electrical components, which may change dynamically. There exists a need for an electrical tuning engine for dynamic, continuously changing electrical characteristics such as impedances, especially for DC and low-frequency AC power systems in electric cars.

An electrical tuning engine (ETE) adjusts an electrical configuration of multiple components of an electrical network. A signal flow diagram of the ETE is shown in FIG. 14. A more detailed version is shown in FIG. 15. The ETE has the following modules: demands module, electrical characteristic determination module, calculation module, and configuration module. Each one will be described in more detail later. The ETE is part of an apparatus (system) that automatically adjusts an electrical configuration of a plurality of components of an electrical network associated with a vehicle in order to tune electrical characteristics of the electrical network to continuously match a dynamically changing desired mode of operation of the electrical network associated with the vehicle, as described in further detail below.

The ETE accepts user inputs, external inputs, and sensor inputs. User inputs are parameters coming directly from the user, such as the trip destination, the preselected EV mode, heating and cooling settings, and forces on the pedals. External inputs are parameters not coming directly from the user, such as vehicle speed and location, fuel and charge levels, computer vision, blind spot detection, GPS, traffic, road conditions, and weather. Sensor inputs are measured parameters of on-board and off-board electrical components, such as charge, voltage, amperage, resistance, capacitance, inductance, temperature, and EMF strength.

The configuration module of the ETE is connected to internal components and external components. Internal components include batteries, SCs, motors, and PECs. External components include the electrical grid, power plants, solar panels, and other cars' electrical systems. The connections between the module and components may be signals, such as digital and analog commands and communications. The connections may also conduct considerable power between the configuration module and the components. Sensors measure electrical characteristics of the components. The component characteristics are fed back into the ETE as sensor inputs.

In performance mode, the ETE should monitor the sources and loads and automatically adjust them to maximize power transfer. FIG. 17 shows another embodiment of FIG. 16 which explicitly shows the sources with their internal impedances. Maximizing power transfer from the source to the load requires the load impedance to closely match the complex conjugate of the equivalent input impedance. Part of the configuration module may adjust the source while another part of the configuration module may adjust the load simultaneously. FIG. 18 shows another embodiment of FIG. 16 wherein the sources' internal impedances form an output impedance stage. FIG. 19 shows another embodiment of FIG. 16 wherein the load impedances form an input impedance stage.

FIG. 20 shows a circuit with a single non-ideal voltage source and a single load impedance connected to a configuration module. Maximum power is transferred from the source to the load when the load impedance matches the complex conjugate of the internal impedance of the source. The load represents the stage immediately after the power source.

Efficiency mode would improve the efficiency of an electric car. A high efficiency means the load receives the majority of the source's real power. This happens when either (1) the real/resistive part of the load impedance greatly exceeds the source's real/resistive internal impedance, (2) when the load impedance greatly exceeds the output impedance from FIG. 18 (i.e., $Re(Z_L) \gg Re(Z_{output})$), or (3) when the input impedance greatly exceeds the source impedance from FIG. 19 (i.e., $Re(Z_{input}) \gg Re(Z_S)$).

Preferred embodiments of the invention may operate in a mode called balanced mode which transfers more real power to the load than efficiency mode but less real power than performance mode. To achieve this, the real power delivered to the load exceeds real power delivered to the source. A fourth mode called wasteful mode transfers much more real power to the source's internal impedance than to the load. This mode may be desired when conditioning batteries and SCs or intentionally generating heat for other reasons. To summarize, preferred embodiments of the invention have several operating modes:

In performance mode, the load and source impedances are exactly or approximately complex conjugates: $Re(Z_L) \cong Re(Z_S^*)$.

In efficiency mode, the load is much greater than the source: $Re(Z_L) \gg Re(Z_S)$.

In balanced mode, the load is moderately greater than the source: $Re(Z_L) > Re(Z_S)$.

In wasteful mode, the source is much greater than the load: $Re(Z_S) \gg Re(Z_L)$.

FIG. 11 shows the prior art equivalent circuit for a constant air-gap induction motor. The circuit models a traction motor inside an EV. The load resistance $R_L$ is the electrical representation of the mechanical load of the rotor. Suppose FIG. 18 represents an EV power system wherein power flows from one or more ESSs through a controller to traction motors. The load impedance is equivalent to $R_L$ from FIG. 11. The term $Z_{output}$ from FIG. 18 is the Thevenin-equivalent impedance, or an approximation of the impedance, of all the stages before $R_L$, including the ESS's internal impedance, the controller's impedance, and the equivalent impedance of the rest of the circuit components in FIG. 11.

The ETE could also configure circuits that manage reactive power compensation. For example, in power systems with induction motors, the ETE could reduce reactive power consumed by the load by connecting it to a source of reactive power, such as a capacitor bank or a synchronous generator.

Preferred embodiments of the invention may utilize wireless transmitters and receivers, such as those used in communication systems and wireless charging.

Preferred embodiments of the invention may configure a supercapacitor auto-balancing circuit that would prevent leakage currents from overcharging component SCs.

Preferred embodiments of the invention may configure a regenerative braking system dynamically for different vehicle speeds and road inclinations.

Preferred embodiments of the invention may utilize an operating database, which communicates with the electrical characteristics determination module and with the calculation module. The operating database logs which components have been installed in the vehicle and their associated specifications. It can also log historical data about the configurations including their performance metrics and their associated sensor inputs.

Preferred embodiments of the invention may incorporate from external sources data about the performance of other vehicles on local roads, or other vehicle passageways, and any expected or unexpected conditions they have encountered. The external data would be transmitted via communication channels such as vehicle-to-vehicle, Bluetooth, Wi-Fi, satellite, and radio. The type of communication network may be an infrastructure network or an ad-hoc network.

The ETE may possess machine-learning and AI capabilities to improve its automatic decisions over time. This function may augment or interact with the operating database and the external data sources. The database might contain precomputed descisions trees, statistical information, or other data. Preferred embodiments of the invention also communicate to servers over vehicle-to-infrastructure communication systems, which could further evaluate inputs and decisions and transmit the decisions and results to ETE databases in other cars to improve their future decisions. Additionally, the ETE in one car could communicate with ETEs in nearby cars over vehicle-to-vehicle communication systems to learn about the performance of other cars on the local roads, and any expected or unexpected conditions encountered. These databases are represented by the database inputs in FIGS. 14 and 15.

FIG. 10 shows two pairs of parallel-connected battery cells with a 20% resistance mismatch. The first pair has (1) and (2), and the second pair has (3) and (4). Cells (1) and (3) have 1.0-Ω internal resistances, and cells (2) and (4) have 1.2-Ω internal resistances; every cell has the same voltage $V_B$. Preferred embodiments of the invention may detect and correct mismatched pairs of cells, as shown in FIG. 27. After reconfiguration, one pair of cells has (1) and (3), both with $R_i$=1.0Ω, and the other pair has (2) and (4), both with $R_i$=1.2Ω. This configuration can greatly extend the lifespan of the batteries.

FIG. 28 shows a series of five identical battery cells numbered (1) through (5) which is in parallel with a series of four identical battery cells numbered (6) through (9). Cells (1) through (5) have 1.0-Ω internal resistances, and cells (6) through (9) have 1.25-Ω internal resistances. The series of five cells and the series of four cells both have total internal resistances of 5.0Ω. When a voltage source or an electrical load is connected across terminals (10) and (11), the same current flows through both series of cells. This configuration may, for example, allow multiple cells with mismatched resistances to charge (or discharge) at once.

FIG. 29 shows nine capacitors of equal capacitances and with internal resistances arranged in the same configuration as the battery cells in FIG. 28. Capacitors (1) through (5) have 1.0-Ω internal resistances, and capacitors (6) through (9) have 1.25-Ω internal resistances. When a voltage source is connected across terminals (10) and (11), capacitors (1) through (5) each acquire one-fifth the source voltage, and capacitors (6) through (9) each acquire one-fourth the source voltage. The energy stored in a capacitor $U_C$ is given by the formula $$U_C = \tfrac{1}{2}CV^2$$

where C is the capacitance in farads and V is the voltage in volts. The energy stored per capacitor (1) through (5) is $$U_C = \left(\frac{1}{2}\right)C\left(\frac{1}{5}\right)^2 = \frac{C}{50} \text{ joules}$$

The energy stored per capacitor (6) through (9) is $$U_C = \left(\frac{1}{2}\right)C\left(\frac{1}{4}\right)^2 = \frac{C}{32} \text{ joules}$$

The energy per capacitor (6) through (9) is greater than the energy per capacitor (1) through (5).

6 Overview for Measuring Load and Source Impedances

FIG. 20 shows a non-ideal voltage source $V_S$ with internal impedance $Z_i$ and a load impedance $Z_L$. They are coupled to a configuration module. The maximum power transfer theorem states that the source transfers maximum power to the load only when $Z_i$ equals the complex conjugate of $Z_L$, i.e., $Z_i=Z_L{}^*$. For the ETE to transfer maximum power from the source to the load, it must determine $Z_L$ and $Z_i$. As shown in FIG. 6, it first supplies a known test voltage $V_1$ to $Z_L$, and then it measures the resulting current $I_1$. Note that voltage $V_1$ and current $I_1$ may be DC or AC phasors. By Ohm's Law, $Z_L=V_1/I_1$. The module can then disconnect from the load after the measurement. If the load is too large to measure, the module may take a measurement across a smaller impedance in series or in parallel to bring the measurement within the range of the ammeter. Alternatively, it may measure the voltage across a constant current source.

To determine $Z_i$, first the open circuit voltage $V_{OC}$ is measured (FIG. 7). Then the current $I_2$ is measured through a circuit with a source $V_S=V_{OC}$ and an impedance $Z_i+Z_2$, where $I_2=V_S/(Z_i+Z_2)$ (FIG. 8). Rearranging the formula yields $Z_i=(V_{soc}/I_2)-Z_2$. As an alternative way to calculate the internal impedance, the voltage across $Z_2$ is measured after measuring $V_{OC}$ (FIG. 9). The formula for the internal impedance is $Z_i=(V_{OC}-V_2)/(V_2/Z_2)=V_{OC}(Z_2/V_2)-Z_2$. Now the ETE knows the load impedance and the source's internal impedance. A similar procedure can be repeated for circuits shown in FIGS. 18 and 19.

7 Deficiencies in Prior Art

FIG. 4 is a prior art configuration of a reconfigurable energy storage system described in the '702 patent with ESS1 (1), ESS2 (2), a DC link (3), and switches (4)-(6). Switch (4) couples ESS1 to the DC link. Switch (6) couples ESS2 to the DC link. Switch (5) couples ESS1 and ESS2 to the DC link in a series connection. Closing both switches (4) and (6) couples ESS1 and ESS2 to the DC link in a parallel connection.

The '702 patent lacks a configuration module that would pair a source impedance with a load impedance. Furthermore, the '702 patent lacks an ETE that monitors impedances and corrects them according to a desired mode. In the present invention a correction may be triggered when the power source or load changes, when the impedances of the elements change by a threshold, when a period of time has elapsed, and/or by other means.

Element (7) in FIG. 24 represents an ETE between the DC link and the ESS configuration. FIG. 25 is a Thevenin-equivalent circuit containing a voltage source $V_S$ supplied by the ESSs, an internal source impedance $Z_i$, and a load impedance $Z_L$, where the DC Link is the load. During regenerative charging, the DC link becomes $V_S$ and the ESSs become $Z_L$. The ETE may also be placed between ESS1 and the DC link and between ESS1 and ESS2. The previous example applies to those circuits in FIGS. 18 and 19, in which either an output impedance replaces the source impedance, or an input impedance replaces the load.

Preferred embodiments of the invention may also reside within the ESS as depicted by elements (8) and (9) in FIG. 26. Such embodiments are especially valuable for reconfiguring lithium-ion battery cells within a battery pack. As previously stated, at 4.5 Coulomb charge and discharge, a 20% internal resistance mismatch reduces lifetime by 40% when compared to batteries with similar resistances.

According to Sun et al. ("An Adaptive Power-Split Strategy for Battery—Supercapacitor Powertrain—Design, Simulation, and Experiment". https://ieeexplore.ieee.org/document/7819565. Accessed Jan. 28, 2020), high temperatures and large loads shorten the lifespans of EV battery packs. Tesla, Inc. compensates by oversizing the battery packs in their cars, thereby increasing weight and cost.

The CAN bus was invented to reduce the physical size and cost of the wiring harness in vehicles. According to Burkacky et al. (https://www.mckinsey.com/industries/automotive-and-assembly/our-insights/rethinking-car-software-and-electronics-architecture), presently the CAN bus and network of ECUs is unsuitable for the coming explosion of data and demand for processing power in intelligent vehicles, which may utilize artificial intelligence and smart sensors.

8 Detailed Methodology

8.1 Receiving Inputs

The categories of inputs to the demands module (DM) are broadly categorized as user inputs, external inputs, and sensor inputs.

8.1.1 User Inputs

User inputs are the parameters usually coming directly from the user, such as the trip destination, heating and cooling settings, and forces on the pedals. Another parameter is the user-selected driving mode. The 2015 Chevy Volt is a plug-in hybrid vehicle which lets a driver choose from the modes Electric, Extended Range, Sport, Mountain, and Hold. Each mode controls the amount of power the motors draw from either the battery or the engine-generator.

8.1.2 External Inputs

External inputs are the parameters not directly controlled by the user, such as:
Speed and location
Fuel tank level
ESS charge levels
Computer vision
Blind spot detection
GPS data
HVAC system settings
Age of vehicle parts and electrical components
Road conditions
Road inclination and curvature (instantaneous and rate of change over time)
Traffic
Weather and environment
 Barometric pressure
 Humidity inside and outside the vehicle
 Temperatures inside and outside the vehicle
 Precipitation
Information about public chargers along the route
 Locations
 Prices
 Companies/networks
Speed limits
Road construction
Police speed traps
Emissions limits
Access to HOV lanes
Approaching emergency vehicles
 Number of occupants
Weight carried and distribution of weight within the vehicle
Tire pressure
Entertainment system usage
Attentiveness of driver
Working Limits of Components
 Min/Max Voltage
 Min/Max Temperature
Ratings of components
Inputs from environment sensors
 Radar
 Ultrasound
 Cameras
  Vision
  Infrared and forward-looking infrared
 Microphones
Noise, vibration, and harshness

8.1.3 Sensor Inputs of Components

Sensor inputs are the electrical characteristics of on-board and off-board electrical components, such as charge, voltage, amperage, impedance, capacitance, inductance, temperature of components, and EMF strength. Section 2.3 describes techniques for determining some of these electrical characteristics. In one embodiment of the invention, some of the sensor inputs are detected by an OMRON 2JCIE-BL01-P1 Environment Sensor (https://www.newark.com/omron-electronic-components/2jcie-bl01-p1/environment-sensor-temp-humidity/dp/72AC8842?st=2JCIE). This device has six sensors for detecting temperature, humidity, light, UV index, barometric pressure, and sound noise. As a PCB model, it may be integrated into the ETE, and it transmits data over Bluetooth.

8.2 Determining a Current Desired Mode of Operation

The demands module selects one of several operating modes. Some modes of operation include:

1. Performance mode—This mode transfers the maximum real power from the source to the load. Maximum power point tracking may be used to attain this mode.
2. Efficiency mode—This mode transfers much more real power to the load than to the other impedances in the circuit.
3. Balanced mode—This mode transfers an amount of real power to the load that is between performance and efficiency modes.
4. Wasteful mode—This mode transfers much less real power to the load than to the other impedances.
5. Dynamic braking mode—This mode temporarily converts the motors of a moving EV into generators, thereby converting some of the EV's kinetic energy into electrical energy. Sub-modes manage the generated electric power:
   a. Rheostatic braking—Power immediately dissipates as heat through resistors.
   b. Regenerative braking—Power charges one or more ESS.
   c. Diversion braking—Divert excess power directly to other systems like HVAC or component heaters/coolers which can make use of it. For example, only running the HVAC when going down a steep slope.
  The types of dynamic braking can work in all modes including performance mode.
6. OFF, charger connected to power—The EV is off and its battery charger is connected to a power source, which may be an electric grid, a solar panel, an external battery pack, or some other source. The power connection may be wired or wireless. This is the best time to start heating or cooling the cabin, running computer tasks, and charging the battery to a higher state of charge. Battery charging may be configured to extend battery lifespan and reduce electricity costs by keeping the state of charge below damaging levels; by charging during off-peak hours; and by scheduling charging to meet the user's schedule to reduce leakage
7. OFF, charger disconnected from power—The EV is off and its battery charger is disconnected from power. It may run climate control more conservatively.
8. Idle—The car is on but not moving, similar to OFF. It has two modes:
   a. Charger connected to power
   b. Charger disconnected from power The demands module selects a desired mode of operation based on the inputs and certain constraints. The constraints may include parameters such as a time limit, an energy budget, or a monetary budget. Suppose the demands module selects a mode of operation for a certain energy budget. Power is a function of both travel time and all the parameters discussed in the previous subsection. Since the energy needed for the trip is the time integral of power, energy is also a function of those parameters. Mathematically, Energy(parameters)=∫Power(*t*,parameters)*dt*.

An internal table can be produced from these calculations. Table 1 tabulates the milestones, parameters, and selected modes for a hypothetical 5-mile trip from an office to a house in a plug-in hybrid vehicle.

At mile 0, the battery has 80% state of charge (SoC), the car is warming or cooling the cabin in preparation for the occupants, and the DM has selected idle mode. The trip then begins, and for the first 1.4 miles the DM selects performance mode because there is an incline ahead that will partially recharge the batteries through regenerative braking. The road is downhill from mile 1.4 to 2.0. The DM selects maximum regeneration mode. The road is flat from mile 2.0 to 3.4, so the DM selects efficiency mode. There is a red traffic light expected at mile 3.6, so the car again regeneratively brakes between mile 3.4 and 3.6, and the DM enters idle mode at the red light. The motors benefit from maximum power when accelerating from this traffic light, so the DM selects performance mode. Mile 4.3 to 5.0 are residential streets, so the DM selects efficiency mode. The car arrives at the destination with 60% SoC. The car is turned off, and the mode briefly switches to OFF, disconnected from power. Motors and ESSs begin to cool down. When the power cord is plugged into the charging port, the DM detects it and enters the mode OFF, connected to power, and charging begins.

TABLE 1

Sample trip for driving a PHEV from an office to a house

| Milestone (Miles from current location) | Parameters | Mode selected |
|---|---|---|
| 0 | 80% SoC, warming or cooling cabin for driver | Idle mode |
| 0 to 1.4 | <80% SoC, downward incline ahead | Performance mode |
| 1.4 to 2.0 | Downhill, regen config | Regen, max braking mode |
| 2.0 to 3.4 | Flat road | Efficiency mode |
| 3.4 to 3.6 | Red light ahead | Regen, max braking |
| 3.6 | Stopped at red light | Idle mode |
| 3.6 to 4.3 | Accelerate from traffic light | Performance mode |
| 4.3 to 5.0 (stop) | Residential streets, 60% SoC | Efficiency mode |
| 5.0 Cool down | | OFF, disconnected from power |
| 5.0 Wall recharge | Connected to power | OFF, connected to power |

8.3 Electrical Characteristics Determination Module

The electrical characteristics determination module (ECDM) determines the internal impedance(s) and load impedance(s) of the components. While some impedances may be determined easily, determining others may require specialized instruments, databases, calculations, predictions, and algorithms. Some parameters of impedances for battery and SC cells include the number of cells, SoC, temperature, and age.

The ECDM may determine electrical characteristics of all three components in FIG. 5. The procedure is shown in FIGS. 6-9. To determine $Z_L$ (FIG. 6), the ECDM computes $V_1/I_1$, where $V_1$ is a known test voltage and $I_1$ is a current measured by an ammeter. To determine $V_S$ (FIG. 7), the ECDM reads an open circuit voltage $V_{OC}$. To determine $Z_i$ (FIG. 8), the ECDM computes $(V_{OC}/I_2)-Z_2$, where $Z_2$ is a known test impedance and $I_2$ is a current measured by an ammeter. To determine $Z_i$ another way (FIG. 9), the ECDM computes $V_{OC}*(Z_2/V_2)-Z_2$, where $Z_2$ is a known test impedance and $V_2$ is a voltage measured by a voltmeter.

The internal impedance of lithium-ion batteries and SCs depends on a number of factors including SoC, number of charge cycles, temperature, and age. The ECDM may determine internal impedances by taking measurements and/or finding them in a table of values. Additionally, the ECDM may predict future impedances. The ECDM may also determine resistances, capacitances, and inductances of components.

8.4 Calculation Module

The calculation module utilizes the determined internal impedance of one or more of the components in a calculation to determine a configuration of the components to meet the needs of the calculated mode of operation. Calculations are described here for performance mode, efficiency mode, balanced mode, and wasteful mode. Over time, artificial intelligence such as machine learning could be used to improve the calculations to meet as many user's needs while conserving as much energy as possible. These calculations may be performed locally or in the cloud. The ETE would further benefit from exchanging data and performance evaluations with ETEs within other cars over communication channels.

8.4.1 Performance Mode

In performance mode, the source sends maximum power to the load. The calculation module must satisfy $Z_i \cong Z_L^*$ under AC conditions and $R_i \cong R_L$ under DC conditions by activating components within the configuration module and/or reconfiguring the loads.

8.4.2 Efficiency and Balanced Modes

In efficiency mode, the real power consumed by the load impedance greatly exceeds the real power consumed by the source's internal impedance. In balanced mode, the real power consumed by the load impedance moderately exceeds the real power consumed by the source's internal impedance. Efficiency mode requires that $Re(Z_L) \gg Re(Z_i)$ and balanced mode requires that $Re(Z_L) > Re(Z_i)$. The calculation module may increase $Re(Z_L)$ and/or decrease $Re(Z_i)$ to meet these conditions by means of connecting additional resistances in series and parallel. FIG. 21 shows a non-ideal voltage source, $V_{Th}$, with a source internal impedance, $Z_{Th}$, and two loads, $Z_1$ and $Z_2$. When the calculation module receives a request for high efficiency, it automatically measures and then rewires $Z_{L1}$ and $Z_{L2}$ to form a large impedance. The calculation module may place $Z_{L1}$ and $Z_{L2}$ in series as shown in FIG. 23. It may also place additional impedances in series. Balanced mode acts similarly, except the total impedance would be less than that for efficiency mode.

The calculation module may also decrease the source's internal impedance. It might reconfigure the power supply so that cells with a lower internal impedance supply power to the load. According to an article "Temperature, Overcharge and Short-Circuit Studies of Batteries used in Electric Vehicles" by A. Lebowski of Gdynia Maritime University (https://www.researchgate.net/publication/316171277_Temperature_Overcharge_and_Short-Circuit_Studies_of_Batteries_used_in_Electric_Vehicles. Accessed Jan. 28, 2020), the internal resistance of lithium-ion cells decreases when their temperature rises. If the power supply comes from lithium-ion cells, the calculation module could increase the temperature of the cells by harnessing their internal heat generation or warming them from heaters. Similarly, the impedance magnitude of SCs falls exponentially with increasing temperature, according to an article titled "Experimental impedance investigation of an ultracapacitor at different conditions for electric vehicle applications" by L. Zhang (https://www.sciencedirect.com/science/article/abs/pii/S0378775315006904. Accessed Jan. 28, 2020). The article states, "The experimental results indicate that the impedance magnitude exhibits an exponential increase as the temperature decreases, while the impedance phase at relatively low or high frequencies is sensitive to temperature variation." Note that placing more battery or SC cells in parallel with equal voltage and internal impedance does not affect the network's efficiency because parallel sources are independent.

8.4.3 Wasteful Mode

In wasteful mode, power consumed by a source's internal impedance greatly exceeds the power consumed by a load's impedance, which means $Re(Z_i) \gg Re(Z_L)$ for linear circuits. The calculation module may either decrease $Re(Z_L)$ or increase $Re(Z_i)$ to meet this condition. The calculation module can use strategies opposite to those used in efficiency mode. Forming series connections of sources and reducing the temperature of lithium-ion battery sources and SC sources would increase $Re(Z_i)$. Conversely, removing resistive loads from series connections, placing resistive loads in parallel (FIG. 22), and increasing the temperature of battery and SC loads would decrease $Re(Z_L)$.

8.5 Configuration Module

The configuration module configures the electrical network to match the current desired configuration of the components. In one embodiment of the design, the configuration module sends control signals to the reconfigurable connections which are located outside the module. In a second embodiment of the design, the configuration module contains the reconfigurable connections. In a third embodiment of the design, the configuration module is a combination of the first and second embodiments of the design.

Components may be internal or external to the electrical network. Internal components include batteries, capacitors, resistors, inductors, and transistors. External components include the electrical grid, power plants, public chargers, solar panels, in-road-chargers, and the power systems of other EVs. Connections that may reconfigure the components may be mechanical, solid state, inductive, capacitive, and Micro-Electro-Mechanical Systems (MEMS). Mechanical connections include buttons, switches, relays, potentiometers, and fuses. Solid state connections such as unidirectional and bidirectional switches consist of diodes and transistors. Inductive and capacitive connections include inductors and capacitors.

The configuration module allows SCs to charge from a low voltage source and then discharge a much higher voltage. In one embodiment, six SCs charge in parallel to a maximum voltage of 2.7 V per SC. When they are reconfigured in series, their total voltage becomes 16.7 V.

FIG. 32 shows a network consisting of six components connected to a configuration module containing single-pole double-throw switches. The network has terminals A and B. In one embodiment of the network, the six components are configured in series with respect to terminals A and B. Table 2 shows the positions of the switches for a series configuration. In a second embodiment, the six components are configured in parallel with respect to terminals A and B. Table 3 shows the positions of the switches for a parallel configuration. In a third embodiment, the six components are configured in a 3-2 configuration, wherein there are 2 parallel groups of 3 components in series with respect to terminals A and B. Table 4 shows the positions of the switches for a 3-2 configuration. In a fourth embodiment, the six components are configured in a 2-3 configuration, wherein there are 3 parallel groups of 2 components in series with respect to terminals A and B. Table 5 shows the positions of the switches for a 2-3 configuration.

Suppose the six components in FIG. 32 are SCs with voltage ratings of 2.7 V, and assume they have no internal impedance nor leakage currents. A reconfigurable electrical network allows the SCs to fully charge when the voltage across terminals A and B is any value between 2.7 V and 16.2 V. In one embodiment of the network, a voltage source of 2.7 V charges SCs configured in a parallel configuration. In a second embodiment, a voltage source of 5.4 V charges SCs configured in a 2-3 configuration. In a third embodiment, a voltage source of 8.1 V charges SCs configured in a 3-2 configuration. In a fourth embodiment, a voltage source of 16.2 V charges SCs configured in a series configuration. Although fully charging the SCs is ideal, the electrical network may also configure the SCs in a way that partially charge them if a maximum voltage is unavailable.

Once the SCs are charged, the reconfigurable electrical network allows the SCs to discharge across terminals A and B at various voltage levels. In one embodiment of the network, SCs are configured in parallel to meet a load of 2.7 V. In a second embodiment, SCs are configured in 2-3 to meet a load of 5.4 V. In a third embodiment, SCs are configured in 3-2 to meet a load of 8.1 V. In a fourth embodiment, SCs are configured in series to meet a load of 16.2 V.

TABLE 2

| | Series Configuration | | | | | | | | | |
| --- | --- | --- | --- | --- | --- | --- | --- | --- | --- | --- |
| Switch | 1 | 2 | 3 | 4 | 5 | 6 | 7 | 8 | 9 | 10 |
| Position | Down | Up | Down | Up | Down | Up | Down | Up | Down | Up |

TABLE 3

| | Parallel Configuration | | | | | | | | | |
| --- | --- | --- | --- | --- | --- | --- | --- | --- | --- | --- |
| Switch | 1 | 2 | 3 | 4 | 5 | 6 | 7 | 8 | 9 | 10 |
| Position | Up | Down | Up | Down | Up | Down | Up | Down | Up | Down |

TABLE 4

3-2 Configuration (2 parallel groups of 3 components in series)

| Switch | 1 | 2 | 3 | 4 | 5 | 6 | 7 | 8 | 9 | 10 |
|---|---|---|---|---|---|---|---|---|---|---|
| Position | Down | Up | Down | Up | Down | Down | Up | Down | Up | Down |

TABLE 5

2-3 Configuration (3 parallel groups of 2 components in series)

| Switch | 1 | 2 | 3 | 4 | 5 | 6 | 7 | 8 | 9 | 10 |
|---|---|---|---|---|---|---|---|---|---|---|
| Position | Down | Up | Up | Down | Down | Up | Up | Down | Down | Up |

8.6 Repeating Steps

The electrical tuning engine repeats the previous steps to ensure that the configuration of components meets the latest desired configuration given the latest inputs. The electrical tuning engine monitors the inputs and the components and waits for certain conditions to change. A condition may include a milestone, a time duration, or an "event" during the trip. Events may include new user inputs, external inputs, sensor inputs, and external data; changes to a power source or a load; and changes to the impedance of the elements by some threshold. Internal to the electrical tuning engine, the repetition logic may make use of a timer, an interrupt, a waypoint, or an odometer metric for a certain distance traveled. A timer may be used to initiate periodic repetitions when conditions do not change often (e.g., driving at a constant speed). An interrupt may be used when conditions change so fast that repetition must begin immediately (e.g., braking and emergency detection). A waypoint may be detected by means of GPS, road signage, dead reckoning, or a sensor device in the road. The repetition logic may also make use of TCP/IP messages, Internal Process Communication (IPC) messages, signals and signal handlers, user callbacks, or other methods of initiating the repetition.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention.

What is claimed is:

1. An apparatus for adjusting an electrical configuration of a plurality of components of an electrical network associated with a vehicle in order to tune electrical characteristics of the electrical network to continuously match a dynamically changing desired mode of operation of the electrical network associated with the vehicle, the electrical characteristics including a source impedance and a load impedance, the apparatus comprising an electrical tuning engine comprised of an electrical circuit configured to:
   (a) receive (i) user inputs, (ii) external inputs, and (iii) a first set of sensor inputs from the components, and determining therefrom a current desired mode of operation, wherein the components are parts of DC or AC power systems, the components including at least one of
      (A) motors, and
      (B) heating, ventilation and air conditioning (HVAC) components;
   (b) receive (i) a second set of sensor inputs from the components, (ii) inputs from an operating database that maintains historical data and data about the components, and (iii) inputs from external data sources, and determine therefrom electrical characteristics of the components;
   (c) calculate a current desired configuration of the components by using (i) the current desired mode of operation and (ii) the determined electrical characteristics of the components;
   (d) configure the electrical network using a configuration module to match the current desired configuration of the components, wherein the configuration module configures the source impedance and the load impedance to match the current desired configuration of the components; and
   (e) continuously repeat steps (a)-(d), thereby reconfiguring the electrical configuration of the components of the electrical network in order to tune the electrical characteristics of the electrical network associated with the vehicle to continuously match a dynamically changing desired mode of operation of the electrical network associated with the vehicle.

2. The apparatus of claim 1 wherein the user inputs include at least one of trip destination, heating and cooling settings, and forces on pedals of the vehicle.

3. The apparatus of claim 1 wherein the external inputs include at least one of location of the vehicle, speed of the vehicle, and electrical storage system (ESS) charge levels of the vehicle.

4. The apparatus of claim 1 wherein the first set of sensor inputs include at least one of voltage, impedance, and state of charge (SoC) of at least one of the components.

5. The apparatus of claim 1 wherein the current desired mode of operation includes one of performance mode, efficiency mode, and balanced mode.

6. The apparatus of claim 1 wherein the electrical characteristics include at least one of internal impedance, load impedance, resistance, capacitance, and inductance of one of the components.

7. The apparatus of claim 1 wherein the calculated current desired configuration of the components is one of series, parallel, or a combination thereof.

8. The apparatus of claim 1 wherein at least one of the first set of sensor inputs is the same sensor input as one of the second set of sensor inputs.

9. The apparatus of claim 1 wherein the configuration module is further configured to repeat its configured functions when triggered by at least one of a timer, an interrupt, a waypoint, and a distance traveled.

10. The apparatus of claim 1 wherein the desired mode of operation is performance mode, and wherein the source impedance and the load impedance are exact or approximate complex conjugates of each other.

11. The apparatus of claim 1 wherein the desired mode of operation is efficiency mode, and wherein the load impedance and the source impedance each have a real part, and wherein the real part of the load impedance is greater than the real part of the source impedance.

12. The apparatus of claim 1 wherein desired mode of operation is wasteful mode, and wherein the load impedance and the source impedance each have a real part, and wherein the real part of the source impedance is greater than the real part of the load impedance.

13. The apparatus of claim 1 wherein the configuration module adjusts the source impedance and the load impedance simultaneously.

\* \* \* \* \*